US006803168B1

(12) United States Patent
Padmanaban et al.

(10) Patent No.: US 6,803,168 B1
(45) Date of Patent: Oct. 12, 2004

(54) COMPOSITION FOR ANTI-REFLECTIVE COATING OR RADIATION ABSORBING COATING AND COMPOUNDS USED IN THE COMPOSITION

(75) Inventors: Munirathna Padmanaban, Somerville, NJ (US); Wen-Bing Kang, Shizuoka (JP); Hatsuyuki Tanaka, Shizuoka (JP); Ken Kimura, Shizuoka (JP); Georg Pawlowski, Shizuoka (JP)

(73) Assignee: Clariant Finance (BVI) Limited, Tortola (VG)

(*) Notice: Subject to any disclaimer, the term of this patent is extended or adjusted under 35 U.S.C. 154(b) by 0 days.

(21) Appl. No.: 09/237,125

(22) Filed: Jan. 26, 1999

(30) Foreign Application Priority Data

May 27, 1997 (JP) .............................................. 9-137088

(51) Int. Cl.$^7$ ......................... G03F 7/004; C08G 18/00; C08G 18/71

(52) U.S. Cl. ............................... 430/270.1; 430/271.1; 430/325; 528/44; 528/69; 528/75; 526/271; 526/326; 526/319

(58) Field of Search .............................. 430/270.1, 325, 430/271.1; 528/75, 44, 69; 526/271, 326, 301, 302, 319, 317.1

(56) References Cited

U.S. PATENT DOCUMENTS

| | | | |
|---|---|---|---|
| 4,370,405 A | | 1/1983 | O'Toole et al. ............. 430/312 |
| 4,575,480 A | | 3/1986 | Kotani et al. ............... 430/192 |
| 4,636,431 A | | 1/1987 | DeBergalis ................. 428/327 |
| 4,663,265 A | * | 5/1987 | Uytterhoeven et al. ..... 430/114 |
| 4,882,260 A | | 11/1989 | Kohara et al. ............. 430/191 |
| 4,971,871 A | * | 11/1990 | Kato et al. .................. 430/49 |
| 4,990,583 A | * | 2/1991 | Wamprecht et al. ........ 526/271 |
| 5,093,414 A | | 3/1992 | Rauterkus et al. .......... 524/813 |
| 5,234,990 A | | 8/1993 | Flaim et al. ................ 524/609 |
| 5,266,651 A | * | 11/1993 | Foss et al. ................ 525/326.5 |
| 5,294,680 A | | 3/1994 | Knors et al. ............. 525/327.4 |
| 5,414,069 A | * | 5/1995 | Cumming et al. .......... 528/310 |
| 5,496,504 A | * | 3/1996 | Bonham et al. ............ 252/600 |
| 5,731,127 A | * | 3/1998 | Ishizuka et al. ......... 430/270.1 |
| 5,851,730 A | * | 12/1998 | Thackeray et al. ...... 430/271.1 |
| 5,886,102 A | * | 3/1999 | Sinta et al. ................. 525/154 |
| 6,048,661 A | * | 4/2000 | Nishi et al. ............. 430/270.1 |

FOREIGN PATENT DOCUMENTS

| | | | |
|---|---|---|---|
| EP | 0542008 | | 5/1993 |
| EP | 0583205 | | 2/1994 |
| JP | 61-035444 | * | 2/1986 |
| JP | 4001762 A | * | 1/1992 |
| JP | 04-026687 | * | 1/1992 |
| JP | 07-028242 | * | 1/1995 |
| JP | 07-036185 | * | 7/1995 |
| WO | 96/34316 | * | 10/1996 |

OTHER PUBLICATIONS

CA 1996:753778*
CA 1990:141429*
Machine English translation of JP 07–036185, Jul. 1995.*
JPO Abstract JP 07–036185, Jul. 1995.*
CA 1995 : 499874.*
Schwalm, R. et al. SPIE, vol. 920, Feb. 1998, 21–26.*
CA 1995 : 490 229.*
Derwent Abstract JP 07–028242, Jan. 1995.*
CA 1986 : 562153.*
JPO Abstract JP 61–35444, Feb. 1986.*
CA 1992 : 449992.*
JPO Abstract JP 04–026687, Jan. 1992.*
Polymer Science Dictionary, Alger, M., Chapman & Hall, 2nd Ed. 1997, p. 424.*
"Design of Bottom Anti–Reflective Layer for Optical Lithography", J. Fahey et al., SPIE, 2195 (1994), pp. 422–446.*
"Antireflection Layers and Planarization for Microlithography," M. Horn, Solid State Technology, Nov. 1991, pp. 57–62.
"Optimization of Optical Properties of Resist Processes,", T. Brunner, Proc. SPIE, vol. 1466, Advances in Resist Technology and Processing VIII (1991) pp. 297–307.

(List continued on next page.)

*Primary Examiner*—Rosemary Ashton
(74) *Attorney, Agent, or Firm*—Alan P. Kass

(57) ABSTRACT

A composition for an anti-reflective coating or a radiation absorbing coating which can form an anti-reflective coating or a radiation absorbing coating having high absorption to exposed radiation in the range of 100 to 450 nm, no diffusion of photo-generated acid to anti-reflective coating and so on, no intermixing of resist and anti-reflective coating layer, good shelf-life stability, and good step coverage and novel compounds and polymers being preferably used in the composition are disclosed. The composition contains an acrylic or methacrylic compound or polymer with an isocyanate or thioisocyanate group bonded through an alkylene group to a side chain thereof or with an amino or hydroxyl group-containing organic chromophore which absorbs radiation in the range of 100 to 450 nm wavelength and is bonded, for example, through an alkylene group to the isocyanate or thioisocyanate group. Resist patters with high resolution are formed on a substrate. A composition for an anti-reflective coating or a radiation absorbing coating are applied on the substrate and baked to form an anti-reflective coating or a radiation absorbing coating layer. Then, a chemically amplified resist is coated thereon and after patternwize exposure, developed. During baking of the anti-reflective coating or radiation absorbing coating, hardening or curing of the coating takes place by the presence of the isocyanate or thioisocyanate group. On the other hand, the exposed radiation having wavelength in the range of 100 to 450 nm is absorbed by organic chromophore.

27 Claims, No Drawings

OTHER PUBLICATIONS

"One Micron Lithography Using A Dyed Resist On Highly Reflective Topography," M. Bolsen, G. Buhr, H.J. Merrem, K. vanWerden, Solid State Technology, Feb. 1986, pp. 83–88.

"High Contrast Single Layer Resists and Antireflection Layers—An Alternative to Multilayer Resist Techniques," C. Nölscher, L. Mader, M. Schneegans, Proc. SPIE vol. 1086 Advances in Resist Technology and Processing VI (1989), pp. 242–250.

"$Tin_x O_y$ As A Barrier Between Cr–SI–(0) And Aluminum Thin Films," K.H. Bäther And H. Schreiber, Thin Solid Films, 200, 1991, pp. 93–116.

"Reduction Of Linewidth Variation For The Gate Conductor Level By Lithography Based On A New Antireflective Layer," G. Czech, L. Mader, K.H. Küsters, P. Küppers, and A. Gutmann, Microelectric Engineering, 21, (1993) pp. 51–56.

"Two Anti–Reflective Coatings For Use Over Highly Reflective Topography," A.T. Jeffries, M. Toukhy and T.R. Sarubbi, Proc. SPIE, vol. 539 Advances in Resist Technology and Processing II (1985), pp. 342–348.

* cited by examiner

COMPOSITION FOR ANTI-REFLECTIVE COATING OR RADIATION ABSORBING COATING AND COMPOUNDS USED IN THE COMPOSITION

TECHNICAL FIELD

This invention relates to a composition for an anti-reflective coating or a radiation absorbing coating useful for forming an antireflective coating or other radiation absorbing coating, a monomeric dye, a polymeric dye or a hardening agent compound being used in the composition, a method of forming an anti-reflective coating or a radiation absorbing coating and a method of preparing resist patterns or integrated circuits using the anti-reflective coating or radiation absorbing coating.

BACKGROUND ART

In the field of semiconductor manufacturing, to obtain integrated circuits with a higher degree of integration, miniaturization techniques of resist pattern size have been studied and development and improvement of lithographic processes using short wavelength exposure tools such as deep ultraviolet ray are proceeding. High performance resist showing good properties on deep ultraviolet exposure, as positive- or negative-working chemically amplified photoresists sensitive to deep ultraviolet (100–300 nm) are known. While such exposure tools in combination with the high performance chemically amplified resists are capable of patterning sub-quarter micron geometry, they bring in several other problems that need to be solved in achieving such high resolutions. One such problem which is well known in the art and is called "standing waves" arising from interference with incident beam and reflective beam reflected on the surface of the substrate. Another limitation is the difficulty in uniformly controlling the linewidth of the resist pattern in a single layer resist process due to thin film interference effects resulting from highly planar and non-planar substrates. Such problems are well documented. See, for example, M. Horn in Solid State Technology, November 1991, p. 57, and T. Brunner, Proc. SPIE, vol.1466, p.297 (1991). Other pattern distortions are caused by light reflected angularly from topographical features, which is called reflective notching and are discussed by M. Bolsen, G. Buhr, H. Merrem, and K. Van Werden, Solid State Technology, February 1986, p.83.

One method to overcome the above-mentioned problems is to add dyes to the photoresists as described in U.S. Pat. No. 4,575,480, U.S. Pat. No. 4,882,260 and so on. When a dye is added to the photoresist to form a photoresist film having high optical density at the exposing wavelength, drawbacks such as loss of resist sensitivity, difficulties during hardening processes, thinning of the resists in alkaline developers and sublimation of the dyes during baking of the films are encountered. Another technique to overcome the problem of forming patterns on reflective topography is a top surface imaging (TSI) processes or multilayer resists (MLR) as described in U.S. Pat. No. 4,370,405. Such methods help to prevent the problems associated with reflectivity but are not only complex but also expensive and not a preferred method. On manufacturing semiconductors, single layer resist (SLR) processes are used commonly because of their simplicity and cost-effectiveness.

Another method to eliminate the interference of light is to reduce the substrate reflectivity through the use of so-called bottom anti-reflective coatings (hereinafter abbreviated as BARC). These coatings have the property of absorbing the light which passes through the photoresist and not reflecting it back. As these coatings, two types, inorganic and organic types are known. Inorganic type include such coatings as TiN, TiNO, TiW and inorganic polymer in the thickness of 300 Å. See, for example, C. Nolscher et al., Proc. SPIE, vol.1086, p.242 (1989), K. Bather, H. Schreiber, Thin Solid Films, 200, 93 (1991) and G. Czech et al., Microelectronic Engineering, 21, p.51, (1993). Other examples of inorganic coating are of titanium, chromium oxide, carbon and α-silicon. These inorganic anti-reflective coatings are usually formed by a vacuum evaporation process, a CVD process, spattering and so on. The inorganic anti-reflective coatings,however, have such problems as require precise control of the film thickness, uniformity of film, special deposition equipment, complex adhesion promotion techniques prior to resist coating, separate dry etching pattern transfer step, and dry etching for removal. Some of inorganic coatings show conductivity. The conductive coating is not available for anti-reflective coating upon manufacturing integrated circuits.

Organic anti-reflective coatings have been generally formulated by adding dyes which absorb at the exposure wavelength to a polymer coating (Proc. SPIE, Vol.539 (1985), p.342). The organic anti-reflective coating can be formed on a substrate by the same method as resist coating and, therefore, need not use special apparatus. Problems of such dye blended coatings include (1) separation of the polymer and dye components during spin coating, (2) migration of dye into resist solvents and (3) thermal diffusion into the resist upon the baking process. All these cause degradation of resist properties and therefore the method of forming an anti-reflective coating by using a polymer coating composition containing a dye is not a preferred method.

Chemically binding the dyes into film forming polymers is another method. Fahey, et al. (Proc. SPIE, Vol. 2195, p.422) propose to use amino group possessing dyes reacted with the acid anhydride groups of poly(vinyl methylether-co-maleic anhydride) as anti-reflective coating materials. The problem with this type of anti-reflective coating composition is that the reaction between amine and the acid anhydride group is not always 100% complete and this leads to the presence of free amines (refer EP 0583205, page 5, lines 17–20). The free amine causes poisoning of the resist at the interface between anti-reflective coating and resist, especially when a chemically amplified resist composition is used and this leads to a problem called footing. The free dye molecules also sublimes during the baking process and deposits on the fabrication instruments and causes contamination problem as well as health hazard to the workers. One more problem of such compositions is that imide compounds are poor in their solubility and need polar solvents normally not used in photoresist formulations. It would be ideal to have the similar solvent as the photoresist for anti-reflective coating for the reason that the photoresist and anti-reflective coating are often formed using the same coater. Further, fine particles are formed in the coating composition due to the by-product of the imidization reaction, water, to cause defects in the resist pattern.

In addition, Fahey et al. proposed another anti-reflective coating material based on a copolymer of methyl methacrylate and 9-methylanthracene methacrylate. However, when using a chemically amplified resist, this system also shows footing problems due to the diffusion of photo-generated acid into the anti-reflective coating (Proc. SPIE, Vol.2195, P.426) as well as intermixing of the resist and the anti-reflective coating. Such polymers are also insoluble in preferred solvents in the art, such as propylene glycol monomethyl ether acetate (PGMFA) and ethyl lactate.

U.S. Pat. No. 5,234,990 reports polysulfone and polyurea polymers which possess inherent light absorbing properties at deep ultraviolet wavelengths. These condensation products have poor film forming properties on a patterned wafer, and therefore, bad step-coverage and the formation of cracks perhaps due to high Tg and rigid structures of such polymers. Ideally, a bottom anti-reflective coating materials should form a soft layer with good step coverage property upon coating and also harden at least after baking, to prevent intermixing of the photoresist and anti-reflective coating layer as well as diffusion of the photo-generated acid.

Yet another European Laid-open Patent application No. 542 008 describes the use of phenolic type resin binders and melamine type cross linkers in combination with thermal or photo acid generators to harden the anti-reflective coating film after coating. Such compositions are poor in their shelf-life stability due to the presence of the cross-linkers and photo acid generators leading to high incidence of film defects and their etch rate is very slow due to the presence of large amounts of aromatic functional groups.

In summary, a good bottom anti-reflective coating material should satisfy the following properties:
(a) good film forming property
(b) high absorption at the desired exposure wavelength
(c) no intermixing with the photoresist
(d) etch-rate much higher than the photoresist
(e) good step-coverage on topography
(f) at least six months shelf-life stability
(g) the composition should be dissolved in a edge-bead rinse (EBR) solvent Unfortunately none of the present bottom anti-reflective coating (BARC) materials satisfy these properties.

The present invention provides materials with the above-mentioned properties which are necessary for a good BARC material; a composition available for forming a BARC which contains the BARC material; a method of preparing thereof; a BARC layer formed by using the materials or composition; a method of forming thereof; and preparing resist patterns or integrated circuits.

The first object of the present invention is to provide a composition capable of forming a bottom anti-reflective layer or a radiation absorbing layer which reduces problems associated with reflected light from the substrate and topography during pattern formation.

The second object of the present invention is to provide a composition capable of forming a bottom anti-reflective coating or a radiation absorbing coating with improved adhesion to substrates for a micro-circuit, very good coating uniformity and no particle formation.

The third object of the present invention is to provide a composition capable of forming a bottom anti-reflective coating or a radiation absorbing coating that has a higher etch rate than the photoresist material applied thereon.

The fourth object of the present invention is to provide novel (co)polymeric materials applicable for bottom anti-reflective coatings or radiation absorbing coatings containing intrinsically cross-linking and highly absorbing functions in a single molecule and which are soluble in similar or the same solvent as the photoresist material applied thereon. The fifth object of the present invention is to provide novel (co)polymeric materials applicable for bottom anti-reflective coatings containing intrinsically cross-linking and highly absorbing functions in a single molecule, eliminating the need for additives with such functions.

The sixth object of the present invention is to provide novel monomers, polymers and copolymers capable of curing (cross-linking) at the baking temperatures to form very hard layers after baking, the resulting anti-reflective coating having no intermixing with photoresist coated thereon and no diffusion of the acid generated in the subsequent exposure steps to the anti-reflective coating and thereby preventing footing.

The seventh object of the present invention is, to provide novel monomers, polymers and copolymers containing chromophores highly absorbing exposed wavelengths and being able to form ultra-thin anti-reflective coatings, which can provide sufficient radiation absorption with a film thickness of 30–300 nm.

The eighth object of the present invention is to provide an anti-reflective coating or a radiation absorbing coating with good radiation absorbing property.

The ninth object of the present invention is to provide a method of easily producing resist patterns with high resolution.

The tenth object of the present invention is to provide a method of easily manufacturing integrated circuits with a high degree of integration.

Further objects of the present invention will become apparent from the following description.

DISCLOSURE OF THE INVENTION

The composition for anti-reflective coating or radiation absorbing coating of the present invention is characterized by containing at least one member selected from, monomers or polymers represented by the following General Formula I or II.

General Formula I

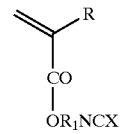

General Formula II

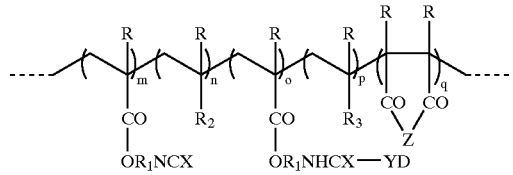

Wherein
R is a hydrogen atom or an alkyl group; $R_1$ is an alkylene group, a substituted alkylene group, a cycloalkylene group, a substituted cycloalkylene, group, a phenylene group or a substituted phenylene group, $R_2$ is a phenyl group, —COOH, a halogen atom, a cyano group, an alkoxyl group, —COOR$_6$ in which $R_6$ is a substituted or non-substituted alkyl or aryl group or an ethylacetoacetate group; $R_3$ is —COOD; D is an organic chromophore which absorbs the exposed wavelength (100–450 nm) and represents a substituted or non-substituted, benzene ring, condensed ring or heterocyclic ring bonded directly or through an alkylene group, X is O or S, Y is O or NR$_4$ group in which R$_4$ is either a hydrogen atom or a substituted or non-substituted, phenyl group or cyclic, linear or branched alkyl group, Z is O, ND group or NR$_5$ group in which R$_5$ is either a hydrogen atom or a substituted or non-substituted, phenyl group or cyclic, linear or branched alkyl group and n, p and q are simple integers including zero and m and o are also simple integers including zero while at least one of them is greater than zero.

Above mentioned composition is coated on a reflective semiconductor substrate such as silicon primed with hexamethyl disilazane, for example, in dry thickness of 300–50,000 Å, baked to evaporate the solvent and harden the film, a thin film being formed. The baking temperature of the film is usually in the range of 50 to 250° C. Then a desired photoresist is coated onto the film, exposed through a mask and developed to produce a resist pattern with predetermined line width. The pattern is transferred to the substrate by dry- or wet-etching the resist pattern. Thus integrated circuit with a high degree of integration are manufactured.

Monomers of the present invention represented by the above mentioned General Formula I can be synthesized from a bifunctional monomer represented by the following General Formula III.

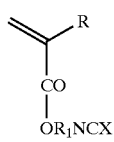

A

Wherein R, $R_1$ and X are as defined above.

It is possible to prepare a variety of monomeric dyes C possessing polymerizable vinyl groups by reacting the bifunctional monomer A represented by General Formula III with amino or hydroxyl group containing chromophore B as shown in the following Reaction Scheme I.

Reaction Scheme I

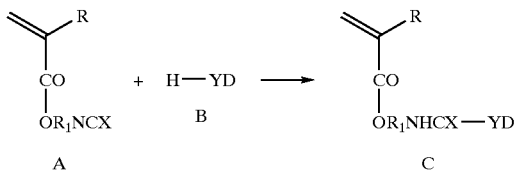

Wherein R, $R_1$, X, Y and D are as defined above.

As examples of D, the following groups are given but by no means limited to these examples: phenyl, substituted phenyl, benzyl, substituted benzyl, naphthalene, substituted naphthalene, anthracene, substituted anthracene, anthraquinone, substituted anthraquinone, acridine, substituted acridine; azobenzene, substituted azobenzene, fluorene, substituted fluorene, fluorenone, substituted fluorenone, carbazole, substituted carbazole, N-alkylcarbazole, dibenzofuran, substituted dibenzofuran, phenanthrene, substituted phenanthrene, pyrene, substituted pyrene and so on. The substitutions in D can be one or more of the followinggroups. That is, alkyl, aryl, halogen, alkoxyl, nitro, aldehyde, cyano, amide, dialkylamino, sulfonamide, imide, carboxylic acid, carboxylic acid ester, sulfonic acid, sulfonic acid ester, alkylamino, arylamino and so on.

As examples of compound A in the Reaction Scheme I which is represented by General Formula III, the following compounds are given: 2-isocyanatoethyl methacrylate, 2-isocyanatoethyl acrylate, 4-isocyanatohexyl acrylate, 4-isocyanatobenzyl methacrylate, 3-isocyanatopropyl methacrylate and corresponding compounds which isocyanate group therein is replaced with thioisocyanate group. Preferred examples of compound A include 2-isocyanatoethyl methacrylate and 2-isocyanatoethyl acrylate. Preferred examples of compound B in the reaction scheme I include but by no means restricted to the following: phenol, benzyl alcohol, 4-hydroxybiphenyl, 4-hydroxybenzaldehyde, 7-hydroxy-2-naphthaldehyde, 9-hydroxyanthracene, 9-hydroxymethhylanthracene, phenanthrol, aniline, benzylamine, 2-phenylethylamine, 4-aminobenzenesulfonamide, 4-aminobenzophenone, 4-aminobenzylcyanide, 4-aminobenzoic acid, 4-aminobenzanilide, 4-aminobiphenyl, 1-aminonaphthalene, 1-aminoanthracene, N-(2,4-dinitrophenyl)-1,4-benzenediamine, 4-N,N-dimethylbenzenediamine, 4-aminophenol, 4-aminodiphenyl ether, 4-aminoquinoline, etc. Especially preferred examples of compound B include 1-aminoanthracene, 1-aminonaphtalene and 9-hydroxymethylanthracene.

Compound C thus obtained can be used in a composition for an anti-reflective or radiation absorbing coating as such or by blending with a film forming material. When the compound C is used in the composition, there is some possibility of evaporation as well as leaching of the compound C in the photoresist. Therefore it is preferable to use the compound after polymerization according to the following Reaction Scheme II to yield a high molecular weight, film forming material.

Reaction Scheme II

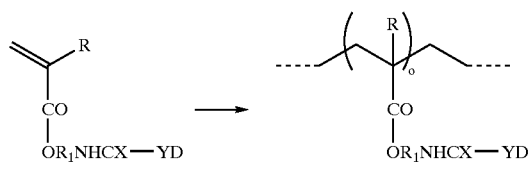

C

Wherein R, $R_1$, X, Y and D are as defined above.

Compound C can also be copolymerized with one or more monomers to impart different functions to the obtained polymeric material such as increased radiation absorption, etch rate, solubility in a particular solvent, shelf-life stability, curing (cross-linking) property and other property improvement as shown in reaction scheme III. For example, suitable comonomers to impart solubility to the polymers are usually acrylates, methacrylates and so on and suitable ones to raise the Tg value of polymers are styrene and its derivatives. Specific comonomers to impart suitable properties to polymers are methyl methacrylate, 2-hydroxyethyl methacrylate, ethyl methacrylate, methyl acrylate, 2-(methacryloyloxy) ethyl. methacrylate, acrylic acid, acrylonitrile, acrylamide, 2-isocyanatoethyl methacrylate, 4-acetoxystyrene, 3-methyl-4-hydroxystyrene, styrene, vinyl chloride, ethyl vinyl ether, butyl vinyl ether, isobutyl vinyl ether, cyclohexyl vinyl ether, methyl vinyl ether, maleic anhydride, maleimide, N-substituted maleimides, vinyl acetate and 2-isocyanatoethyl acrylate. Examples of comonomers classified under every property are as follows. That is, comonomers for increasing radiation absorption when used with organic chromophores include 2-isocyanatoethyl methacrylate, maleic anhydride, maleimide, N-substituted maleimides, 2-isocyanatoethyl acrylate and soon, comonomers for increasing etch rate are methyl methacrylate, 2-hydroxyethyl methacrylate, ethyl methacrylate, methyl acrylate, acrylic acid, vinyl chloride and so on; comonomers for improving solubility in usual photoresist solvent such as PGMEA and, ethyl lactate include 2-(methacryloyloxy)ethyl methacrylate, acrylic acid, 4-acetoxystyrene, 3-methyl-4- hydroxystyrene, ethyl vinyl ether, butyl vinyl ether, isobutyl vinyl ether, cyclohexyl vinyl ether, methyl vinyl ether, vinyl acetate and so on; comonomeres for improving curing (cross-linking) property include 2-isocyanatoethyl methacrylate, 2-isocyanatoethyl acrylate and so on; and comonomers for raising Tg value include styrene, 3-methyl-4-hydroxystyrene and so on. However, the above described specific compounds and properties are only illustrative and not limited to these groups of compounds. Any comonomers represented by General Formulas in the following Reaction Scheme III can be used.

Reaction Scheme III

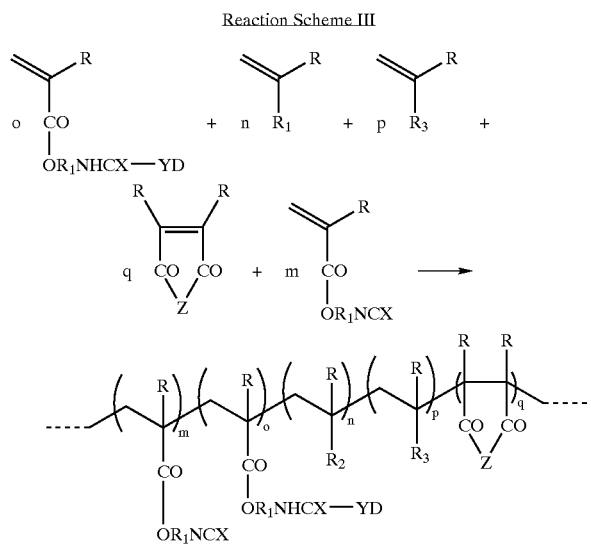

Wherein R, $R_1$, $R_2$, $R_3$, D, X, Y and Z are as defined above, and n, p and q are simple integers including zero and m and o are also simple integers including zero while at least one of them is greater than zero.

As shown above, according to the present invention, the polymeric dyes can be synthesized by homopolymerization of monomeric dyes shown as the compound C or copolymerization of it with comonomers. Further, the polymeric dyes can also be synthesized by reacted polymers containing isocyanate or thioisocyanate groups in a side chain with an amino or hydroxyl group containing chromophore (D-YH) as shown in the following Reaction Scheme IV.

Reaction Scheme IV

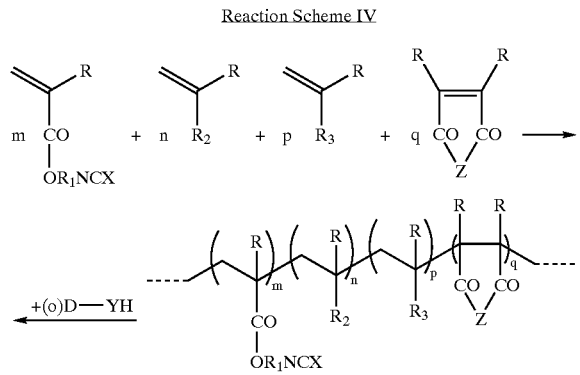

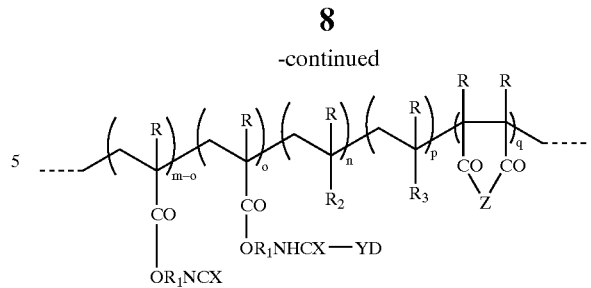

Wherein R, $R_1$, $R_2$, $R_3$, D, X, Y and Z are as defined above, n, p and q are simple integers including zero and m and o are simple integers greater than zero.

Yet another aspect of the present invention is that compound A (represented by General Formula III) possessing isocyanate and/or thioisocyanate groups or polymers prepared by polymerization of monomers containing compound A as shown in following reaction scheme V can be used in a composition for an anti-reflective coating or a radiation absorbing coating to impart a cross-linking or hardening function. Incorporation of such functions help to prevent the intermixing as well as diffusion of acid generated in positive-working photoresist into the anti-reflective coating or radiation absorbing coating leading to complete removal of photoresist material upon development process. It is also possible to use isocyanate or thioisocyanate containing monomers or polymers to blend with other polymeric dyes and/or monomeric dyes in order to harden the anti-reflective coating material upon baking. These isocyanate or thioisocyanate containing polymers or monomers are usually able to cure the anti-reflective coating or radiation absorbing coating by using 0.1–40% of the sum of the moles of monomer and monomer unit of polymer containing isocyanate or thioisocyanate groups based on the sum of the moles of monomers and monomer units of polymer in the anti-reflective coating or radiation absorbing coating. As described, blocked isocyanate or thioisocyanate group containing monomer and polymer show the same curing function as non-blocked ones. Therefore the blocked ones are equally treated with the non-blocked ones when used as an additive.

Reaction scheme V

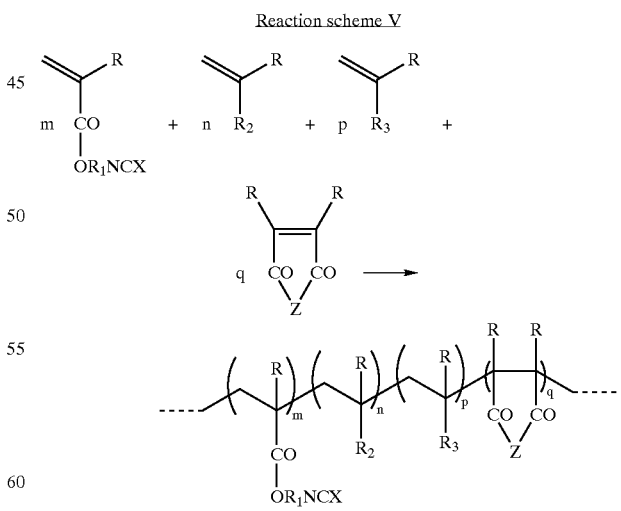

Wherein R, $R_1$, $R_2$, $R_3$, X and Z are as defined above, m is a simple integer above zero and n, p and q are any simple integers including zero.

Further, anti-reflective coatings (BARC) consisting of film forming polymer chemically connected with dyes are proposed. As materials used for constructing these anti-reflective coatings, for example, polymers in which acid anhydride moieties are reacted with dyes containing an amino group are known. But as all of the dyes do not react, free amines remain in the anti-reflective coating. In the case of using a chemically amplified resist as a photoresist, the remaining amine in the anti-reflective coating reacts with the acid generated in the photoresist by exposure to cause the footing. When polymers reacted with hydroxyl group containing dyes are used, the hydroxyl group containing dyes remain in the anti-reflective coating and footing may occur as when using amino group containing dyes. Adding polymers and/or monomers containing isocyanate or thioisocyanate groups represented by General Formula II or III to anti-reflective coating containing a free amine or hydroxyl group containing compound helps to prevent the footing problem due to binding of the free amine or hydroxyl group containing compound with isocyanate or thioisocyanate groups in polymers or monomers.

Isocyanate or thioisocyanate group containing monomers and/or polymers have a relatively good shelf-life. However as activity of the isocyanate or thioisocyanate group is high, the isocyanate or thioisocyanate group containing coatings suffer from the problem of cross-linking and deterioration with time. When compounds represented by General Formula $R_7$—OH (wherein $R_7$ represents a substituted or non-substituted linear or branched alkyl group, a substituted or non-substituted cyclohexyl group or a substituted or non-substituted phenyl group which are bonded directly or through an alkylene group such as a methylene group) are added to these monomers and/or polymers, the isocyanate or thioisocyanate group change to the General Formula —NHCOOR$_7$ or —NHCSOR$_7$to be blocked. Therefore, the high activity of isocyanate or thioisocyanate groups is controlled and the shelf-life of the composition containing monomers or polymers with these groups is improved. By the process of blocking of isocyanate or thioisocyanate groups, it is possible to improve the shelf-life of the compound as well as to conduct easy refining of monomers or polymers. It is also possible to improve solubility in solvents. After the composition containing monomers or polymers with blocked isocyanate or thioisocyanate group is coated as an anti-reflective coating or radiation absorbing coating and then baked, it results in curing or cross-linking as well as non-blocked ones. Therefore it is thought that a blocked isocyanate or thioisocyanate group acts for curing or cross-linking. The blocking of isocyanate or thioisocyanate groups maybe one part or all of the isocyanate or thioisocyanate group. Polymers where the isocyanate or thioisocyanate group is blocked are represented by following General Formula V.

General Formula V

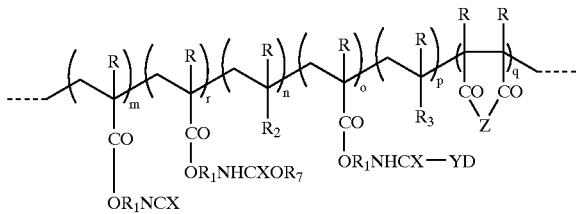

Wherein R, $R_1$, $R_2$, $R_3$, $R_7$, D, X, Y and Z are as defined above, m, n, o, p and q are any simple integers including zero and r is a simple integer greater than zero.

According to the present invention, a polymerization process can be carried out in a suitable solvent either using free radical or ionic initiators. The copolymer may be any copolymer structure such as a random copolymer, block copolymer and so on. Preferred solvents to carry out the polymerization include toluene, tetrahydrofuran, benzene, dimethylformamide, dimethyl sulfoxide, ethyl lactate, propylene glycol monomethyl ether acetate (PGMEA) and so on. These solvents can be used individually or by combination of two or more.

Illustrative initiators include but are not restricted to 2,2'-azobis(isobutyronitrile) (AIBN), 2,2'-azobis(4-methoxy-2,4-dimethylvaleronitrile), 2,2-azobis(2-cyclopropylpropionitrile), 2,2'-azobis(2,4-dimethylvaleronitrile), 2,2'-azobis(2,4-dimethylpentanenitrile), 1,1'-azobis (cyclohexanecarbonitrile), benzoyl peroxide, t-butyl peroxybenzoate, di-t-butyl diperoxyphthalate, t-butyl peroxy-2-ethylhexanoate, t-butyl peroxypivalate, t-amylperoxypivalate, butyl lithium.

Solvent upon synthesis of polymeric dyes according to reaction scheme IV include cyclopentanone, cyclohexanone, butyrolactone, propylene glycol, monomethyl ether acetate, 2-heptanone, ethyl lactate, ethyl-3-ethoxypropionate, ethylene glycol monoethyl acetate, methyl-3-methoxypropionate and so on. These solvents can be used individually or by blending two or more.

The polymeric dyes are isolated from the solvent and, dissolved in a suitable solvent to prepare a composition for an anti-reflective or radiation absorbing coating. If the solvent upon synthesizing the polymeric dye is usable for the anti-reflective or radiation absorbing coating composition, the reaction composition can be used directly without isolating of polymers for preparing the anti-reflective or radiation absorbing coating composition or be coated directly onto a substrate such as wafer. It is preferred to filter the anti-reflective coating or radiation absorbing coating with, for example, 0.5 and 0.2 micron filters and remove insoluble minute particles. The filtrate can be applied directly onto a substrate, for example, a wafer and baked at 50 to 250° C. to form an anti-reflective coating or a radiation absorbing coating. However the filter used for filtering is not limited to the above described ones. It need scarcely without saying that any polarized filters are usable, if necessary.

The molecular weights of the homo- or copolymers prepared in reaction schemes II to V range between 500 to 5,000,000 daltons with respect to standard polystyrene as measured on a gel-permeation chromatography (GPC). Preferred molecular weight lies between 3,000 and 100,000 daltons considering the film forming property, solubility characteristics and thermal stability. The molecular weights of the obtained polymers depend on the polymerization conditions such as polymerization time, temperature, monomer and initiator concentration, reaction medium, and can be easily controlled by proper selection or adjustment of these parameters. Narrow molecular weight distribution can also be obtained by choosing ionic polymerization.

The mole ratio of the comonomers in Reaction Schemes III, IV and V depends on the reaction rates of the respective monomers as well as the reaction conditions used and the mole ratio used in the reaction feed. The absorption at the desired wavelength and the refractive index of the final polymer play an important role in the applicability of the polymer for bottom-anti reflective coatings and the like. Absorption in the range of 2 to 40 per micron film thickness is desired and between 5 and 25 is especially preferred and should be maintained in the copolymers as well. Too high an absorption and too low an absorption may lead to bad performance of the anti-reflective coating. Also the required radiation absorption property for an anti-reflective coating material depends on the radiation absorption property and refractive index of the photoresist material applied on the anti-reflective coating. The refractive index of the anti-reflective coating would be the best if it exactly matches or at least is very close to that of the resist layer applied on top. The radiation absorbing property of an anti-reflective coating material depends on the molecular extinction coefficient of the monomer containing chromophore and it's mole ratio. Therefore the mole percent of the monomer containing the chromophore is important to control the absorption property. This can be easily controlled or tailored in the present invention as shown in reaction schemes III or IV to prepare polymers having the desired mole ratio.

The composition for an anti-reflective coating or a radiation absorbing coating of the present invention contain one or more solvents. The anti-reflective coating and radiation absorbing coating material are dissolved in a solvent for the composition. The solubility of the anti-reflective coating materials and radiation absorbing coating materials in safe solvents are also important in its application as an anti-reflective coating or a radiation absorbing coating. This is not restricted to safety considerations as long as the solvent can dissolve the anti-reflective coating or radiation absorbing coating material and other additives (surfactants, plasticizers, cross-linkers, etc.) to improve the film forming properties. From the standpoint of safety, solubility, boiling point and film formation, examples of preferred solvents may include propylene glycol monomethyl ether acetate (PGMEA), ethyl lactate (EL), cyclohexanone, cyclopentanone, 2-heptanone and the like and combinations thereof. Solubility of the anti-reflective coating or radiation absorbing coating material of the present invention itself can be controlled by properly choosing suitable comonomers as shown in reaction schemes III, IV and V.

Apart from the dye compounds and solvent described above, the composition for an anti-reflective or radiation absorbing coating may also contain surfactants and other additives to form a uniform, defect free anti-reflective coating or radiation absorbing coating on the semiconductor substrate on which the composition is applied. As examples of surfactants, fluorinated or siloxane compounds can be illustrated but usable surfactants are not limited to these groups of compounds.

Another property required for the polymer for a bottom anti-reflective coating is the etch rate of the coating. Skilled artists in the semiconductor industry will appreciate a bottom anti-reflective coating material that has significantly higher etch rate than the resist itself, in order to successfully transfer the pattern after exposure and further processing steps. This property of the polymer can also be controlled by properly selecting the comonomers in the Reaction Schemes III, IV and V. In general aromatic compounds have poor etch rates. Therefore, as comonomers, aliphatic group containing monomers as well as monomers possessing non-carbon elements such as oxygen, nitrogen, or halogen atom are preferably incorporated to increase the etch rate.

The glass transition temperature (Tg) of the anti-reflective coating or radiation absorbing coating material plays an important role in the intermixing property of the anti-reflective coating or radiation absorbing coating and the photoresist applied thereon. Intermixing of the coating and the photoresist would lead to incomplete removal of the photoresist upon development. Yet another problem when a chemically amplified photoresist material is applied on an anti-reflective coating or radiation absorbing coating material with low Tg is that the acid formed in photoresist upon exposure may diffuse into the BARC layer, which leads to a distorted latent acid image and can also cause incomplete removal of the photoresist material upon development. Therefore, it is desirable that the anti-reflective coating or radiation absorbing coating material has a glass transition temperature at least above the maximum processing temperature, such as the baking temperature used, while forming the photoresist layer. Again the glass transition temperature of the polymers of the present invention can be controlled by choosing the appropriate type and amounts of monomers shown in Reaction Schemes III, IV and V.

The preferred examples of polymers represented by General Formula II which can use in a composition for an anti-reflective coating or a radiation absorbing coating of the present invention include those represented by the following General General Formula II'

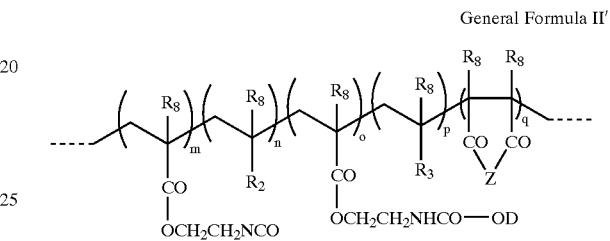

Wherein $R_8$ is a hydrogen atom or a methyl group, $R_2$ is a phenyl group, —COOH, a halogen atom, a cyano group, an alkoxyl group or —COOR$_6$ in which $R_6$ is a substituted or non-substituted alkyl or aryl group or an ethylacetoacetate group; $R_3$ is —COOD; D is an organic chromophore which absorbs the exposed wavelength (100–450 nm) and represents a substituted or non-substituted benzene ring, condensed ring or heterocyclic ring bonded directly or through an alkylene group, Z is O, ND group or NR$_5$ group in which $R_5$ is either a hydrogen atom or a substituted or non-substituted, phenyl group or cyclic, linear or branched alkyl group and m, n, o, p and q are simple integers including zero and at least one of m and o is greater than zero.

General Formula II''

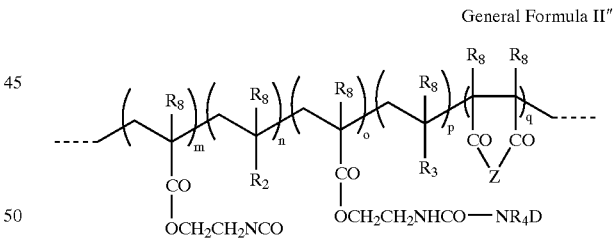

Wherein $R_8$ is a hydrogen atom or a methyl group, $R_2$ is a phenyl group, —COOH, a halogen atom, a cyano group, an alkoxyl group or —COOR$_6$ in which $R_6$ is a substituted or non-substituted alkyl or aryl group or an ethylacetoacetate group, $R_3$ is —COOD, D is an organic chromophore which absorbs the exposed wavelength (100–450 nm) and represents a substituted or non-substituted, benzene ring, condensed ring or heterocyclic ring bonded directly or through an alkylene group, $R_4$ is either a hydrogen atom or a substituted or non-substituted, phenyl group or cyclic, linear or branched alkyl group, Z is O, ND group or NR$_5$ group in which $R_5$ is either a hydrogen atom or a substituted or non-substituted, phenyl group or cyclic, linear or branched alkyl group and m, n, o, p and q are simple integers including zero and at least one of m and o is greater than zero.

In above described General Formula II' or II", preferred examples of m, n, o, p and q include that;
(1) m, n, p and q are zero and o is between 5 to 50,000,
(2) n, p and q are zero, sum of m and o is between 5 to 50,000 and mol fraction of m is between 0.05 to 0.95,
(3) m, p and q are zero, sum of n and o is between 5 to 50,000 and mol fraction of n is between 0.05 to 0.95,
(4) p and q are zero, sum of m, n and o is between 5 to 50,000 and mol fraction of n is between 0.05 to 0.95,
(5) n, o and p are zero, sum of m and q is between 5 to 50,000 and mol fraction of q is between 0.05 to 0.50,
(6) n, o and q are zero, sum of m and p is between 5 to 50,000 and mol fraction of m is between 0.05 to 0.90, and
(7) q is zero and sum of m, n, o and p is between 5 to 50,000.

In case of above (1) and (3), polymers in which $R_2$ is —$COOR_6$ where $R_6$ is a methyl group, an ethyl group, a t-butyl group, an isopropyl group, an ethylacetoacetate group, a 2-hydroxyethyl group or an n-butyl group are more preferred.

The anti-reflective coating or radiation absorbing coating materials of the present invention can be used for both positive- and negative-working resist materials. Therefore any resist known for ever can be used and all of them should successfully form images with no standing waves and no reflective notching depending on reflecting, no intermixing and no diffusion of photo-generated acid based on hardening of the coating, good developing and high resolution. In the point of view of resolution of resist image formed, as a resist, a chemically amplified resist and quinone diazide type resist is preferred. The exposure is conducted by using radiation in the range of 100 and 450 nm wavelength as the radiation source.

In the present description, when a number of substituents are shown by the same designation, for example, R, $R_1$, $R_8$, D, X, etc. exist in one General Formula, each substituent showed by the same designation in the General Formula can be selected individually from among atoms or groups comprising the substituent and be the same or different atoms or groups.

BEST MODE FOR CARRYING OUT THE INVENTION

The present invention is now described in more detail by reference to the following examples but these examples are not construed to be limiting at all.

In the following examples, a bottom anti-reflective coating (BARC) was formed by the method described in the following Application Example 1 and evaluations of the BARC materials produced were then carried out.

APPLICATION EXAMPLE 1

A 5 wt % solution of the BARC material in an appropriate solvent was filtered using 0.5 and 0.2 micron filters, spin coated onto a 6 inch silicon wafer at a suitable rpm for 40 seconds such that the BARC film had a thickness of 60 nm after baking at 200° C. for 60 seconds. The film was checked under microscope to identify any defects. The optical constants n (refractive index) and k (absorption coefficient) values of the film were measured on a ellipsometer at the respective wavelengths (248 nm or 356 nm).

A 700 nm thick positive- or negative-working, chemically amplified deep ultraviolet photoresist, a 500 nm thick positive-working argon fluoride (193 nm) photoresist and a 1000 nm positive-working, negative-working i-line novolak resist were then applied over the BARC by spin-coating at a suitable rpm for 40 seconds. The resists were then soft baked for 60 seconds at 110° C. and exposed on a stepper operating with an excimer laser (248 nm) source in the case of the DUV resist, a stepper fitted with argon fluoride light source in the case of argon fluoride resist (193 nm) or an i-line (356 nm) stepper in the case of i-line resist using a reticle with line and space patterns. Following the exposure, the resists were post-exposure baked at 90° C., developed using a 0.24 N tetramethylammonium hydroxide developer solution except being 0.05 N ones in case of the argon fluoride resist, for 60 seconds at 23° C. to form the resist patterns. The resist patterns were examined on a scanning electron microscopy to check the resolution, standing waves, reflective notching, and footing of the line and space.

In order to evaluate the step-coverage property of the BARC material, the BARC material followed by resist was again coated and processed onto a patterned wafer as described above and the pattern formed was checked using a scanning electron microscopy. The etch rate of the BARC materials were then evaluated using oxygen and fluoride gas plasma.

The following resists were used in the evaluation.
Chemically Amplified Deep Ultraviolet Photoresist
   Clariant DUV resist AZ®-DX-1100P
193 nm Positive-working Resist

| terpolymer | (rate of monomer) |
|---|---|
| t-butyl methacrylate | 30 |
| methacrylic acid | 40 |
| adamantyl methacrylate | 30 |

MW=20,000
   The terpolymer was dissolved in solvent (PGMEA) to a concentration of 20% by weight and
   bicyclohexyl diazomethane was added to the solvent (PGMEA) to provide a 1% by weight solution
i-line Novolak Resist
   Clariant i-line resist AZ®-7500
   The materials used for preparing the anti-reflective coating materials were synthesized according to the following synthesis examples.

SYNYTHESIS EXAMPLE 1

Polymerization of 2-methacryloyloxyethyl isocyanate (PIEM)

Into a three neck flask fitted with a condenser, a nitrogen inlet and a nitrogen outlet, there was added 108.6 g of 2-methacryloyloxyethyl isocyanate, 2.299 g of 2,2'-azobis (isobutyronitrile) (AIBN) and 623 g of tetrahydrofuran and the contents were purged with dry nitrogen gas. The reaction mixture was heated to 70° C. and stirred at that temperature for 7 hours under flowing nitrogen gas. After the completion of the reaction, it was cooled to room temperature and the polymer formed was reprecipitated into n-hexane. The white powder obtained was,dried under vacuum (1 Torr) at room temperature to, yield 100 g (92.1% yield) of polymer. The polymer had a weight average molecular weight (Mw) of 21,300 and a number average molecular weight (Mn) of 10,400 as measured on a gel-permeation chromatography (GPC) using a polystyrene standard. The polymer was then dissolved, respectively, in dyclohexanone and propylene glycol monomethyl ether acetate (PGMEA) (each 5 wt % solid contents) and stored for further use described below.

SYNTHESIS EXAMPLE 2

Copolymerization of 2-methacryloyloxyethyl isocyanate and methyl methacrylate

Into a three neck flask fitted with a condenser, a nitrogen inlet and a nitrogen outlet, there was added 54.3 g (0.35 mol)

of 2-methacryloyloxyethyl isocyanate, 35.042 g (0.35 mol) of methyl methacrylate, 1.149 g of AIBN and 623 g of tetrahydrofuran and the contents were purged with dry nitrogen gas. The reaction mixture was heated to 70° C. and stirred at that temperature for 7 hours under flowing nitrogen gas. After the completion of the reaction, it was cooled to room temperature and the polymer was reprecipitated into n-hexane. The white powder obtained was dried under vacuum (1 Torr) at room temperature to yield 80 g of polymer. The infrared spectrum of the polymer showed peaks at 2278 cm$^{-1}$ (NCO) and at 1717 and 1707 cm$^{-1}$ (C=O). The copolymer was found to have about 40 mol % of methyl methacrylate units based on the $^1$H-NMR spectrum. The polymer had a weight average molecular weight (Mw) of 25,700 and a number average molecular weight (Mn) of 13,900 as measured on GPC using polystyrene standard. The polymer was then dissolved, respectively, in cyclohexanone and propylene glycol monomethyl ether acetate (PGMEA) (each 5 wt % solid contents) and stored for further use described below.

SYNTHESIS EXAMPLE 3

Copolymerization of 2-methacryloyloxyethyl isocyanate and maleic anhydride

The same procedure as Synthesis Example 2 was used except that methyl methacrylate was replaced with 34.32 g of maleic anhydride. The yield was 45%. The polymer had a weight average molecular weight (Mw) of 23,700 and a number average molecular weight (Mn) of 11,900 as measured on GPC using polystyrene standard. The infrared spectrum of the polymer showed peaks at 2278 cm$^{-1}$ (NCO) and at 1717 and 1707 cm$^{-1}$ (C=O). The copolymer was found to have about 50 mol % of maleic anhydride units based on the $^1$H-NMR spectrum. The polymer was dissolved in cyclohexanone (5 wt % solid content) and stored for further use described below.

EXAMPLE 1-1a

Reaction of 1-aminoanthracene with poly(2-methacryloyloxyethyl isocyanate) and application as a bottom anti-reflective coating material To a 200 g (5 wt. % solid content, 0.064 mol) solution of poly(2-methacryloyloxyethyl isocyanate) in cyclohexanone, from Synthesis Example 1, there was added 12.4 g (0.064 mol) of 1-aminoanthracene and the contents were stirred at room temperature for 48 hours. After the completion of the reaction, a small portion of the solution was reprecipitated into n-hexane to characterize the reaction product. The infrared spectrum of the product showed peaks at 3341 cm$^{-1}$ (N—H), 1715 cm$^{-1}$ (C=O, ester) and at 1635 cm$^{-1}$ (C=O, urea) and the complete disappearance of the peak at 2278 cm$^{-1}$ indicating the complete reaction of the isocyanate groups of poly(2-methacryloyloxyethyl isocyanate) with 1-aminoanthracene. The remaining portion of the reaction mixture was filtered and evaluated as a BARC material, as described in the Application Example 1 using a deep ultraviolet positive-working resist and a deep ultraviolet stepper fitted with a 248 nm excimer laser as the radiation source. The BARC film was checked under microscope and was found to be defect free and uniform. The optical constants n and k values of the film were 1.423 and 0.58 at 248 nm, respectively, (see Table 1). Observation of the line and space patterns on a scanning electron microscopy showed that the resist profiles were vertical (88–90°), had a resolution of 0.17 microns and the patterns had no standing waves.

A comparative test using exactly the same method but without the BARC layer, showed patterns with severe standing waves due to reflection from the silicon substrate and a resolution of only 0.20 microns. The etch rate of BARC layer, using oxygen and fluoride gas plasma, was measured to be 80 nm/min, whereas the resist of this example had an etch rate of 78 nm/min.

The step coverage of the BARC material was also checked and compared with commercially available BARC materials. It was observed that the BARC material, 1a of the present invention had a very good step-coverage property as observed on a scanning electron microscopy.

EXAMPLE 1-1b TO 1h

The same procedures as in Example 1-1a were repeated except simply varying the amount of 1-aminoanthracene (AA) with respect to the isocyanate groups, as described in Table 1, deep ultraviolet BARC materials 1b to 1h, with different refractive indexes, absorptions and etch rates were obtained as showed in Table 1.

TABLE 1

| Example | mol % of AA | refractive index (n) | absorption coefficient at 248 nm (k) | etch rate (nm/min) |
|---------|-------------|----------------------|--------------------------------------|--------------------|
| 1-1a | 100 | 1.423 | 0.58 | 80 |
| 1-1b | 90 | 1.462 | 0.55 | 88 |
| 1-1c | 70 | 1.542 | 0.49 | 98 |
| 1-1d | 50 | 1.580 | 0.45 | 105 |
| 1-1e | 40 | 1.592 | 0.42 | 115 |
| 1-1f | 30 | 1.605 | 0.39 | 125 |
| 1-1g | 20 | 1.624 | 0.30 | 130 |
| 1-1h | 10 | 1.645 | 0.25 | 145 |

Similar to Application Example 1, the materials of Examples 1-1b to 1h were applied as a BARC material and evaluated by using, as resists, a positive- and a negative-working deep ultraviolet (DUV) resist, a positive-working argon fluoride (193 nm) resist, and a positive- and a negative-working i-line resists, as well as the corresponding radiation tools. They were all found to be effective in eliminating the problems (standing waves, reflective notching) associated with reflection and scattering of exposed radiation. In addition, similar to Examples 1-1b to 1h, the BARC material of Example 1-1a was processed and evaluated. It showed very good properties.

EXAMPLES 1-2 TO 1-7

Similar to the procedure used in Example 1-1a except that 1-aminoanthracene was replaced with amino group containing dyes described in Table 2, reactions of the amino group containing dyes, with poly(2-methacryloyloxyethyl isocyanate) were conducted and each polymer obtained (1-2 to 1-7) had refractive index, absorption coefficient and etch rate as shown in Table 2.

TABLE 2

| Example | Dye with amino group | refractive index (n) | absorption coefficient at 365 nm (k) | etch rate (nm/min) |
|---------|----------------------|----------------------|--------------------------------------|--------------------|
| 1-2 | aniline | 1.632 | 0.20 | 140 |
| 1-3 | 4-aminobenzene sulfonamide | 1.651 | 0.22 | 145 |

TABLE 2-continued

| Example | Dye with amino group | refractive index (n) | absorption coefficient at 365 nm (k) | etch rate (nm/min) |
|---|---|---|---|---|
| 1-4 | 4-aminobenzanilide | 1.532 | 0.28 | 134 |
| 1-5 | 1-aminonapthalene | 1.452 | 0.48 | 110 |
| 1-6 | N-(2,4-dinitrophenyl)1,4-benzene diamine | 1.488 | 0.30 | 142 |
| 1-7 | 2-amino-4-chloroanisole | 1.430 | 0.41 | 150 |

Similar to Application Example 1, the materials of Examples 1-2 to 1-7 were applied as a BARC material and evaluated by using, as resists, a positive- and a negative-working deep ultraviolet (DUV) resist, a positive-working argon fluoride (193 nm) resist, and positive- or negative-working i-line resists, as well as the corresponding radiation tools. They were all found to be effective in eliminating the problems (standing waves, reflective notching) associated with reflection and scattering of exposed radiation.

EXAMPLE 2-1a

Reaction of 9-hydroxymethylanthracene with poly (2-methacryloyloxyethyl isocyanate) and application as a bottom anti-reflective coating material To a 200 g (5 wt % solid content, 0.064 mol) solution of poly(2-methacryloyloxyethyl iso-cyanate) in cyclohexanone, prepared in Synthesis Example 1, there was added 13.32 g (0.064 mol) of 9-hydroxymethylanthracene and 0.2 g of dibutyl tin dilaurate and the contents were stirred and reacted at room temperature for 48 hours. After completion of the reaction, a small portion of the solution was reprecipitated into n-hexane to identify the reaction product. The infrared spectrum of the product showed peaks at 3323 cm$^{-1}$ (N—H), 1717 cm$^{-1}$ (C=O, ester) and at 1707 cm$^{-1}$ (C=O, carbamate) and the complete disappearance of the peak at 2278 cm$^{-1}$, indicating the complete reaction of isocyanate groups of poly(2-methacryloyloxyethyl isocyanate) with 9-hydroxymethylaminoanthracene. The remaining portion of the reaction mixture was filtered and evaluated as a BARC material, as described in Application Example 1. The BARC film was checked under microscope and was found to be defect free and uniform. The optical parameters n and k of the BARC film at 248 nm were found to be 1.400 and 0.60 respectively (Table 3). Observation of the line and space patterns on a scanning electron microscopy showed that: the resist profiles were vertical (88–90°), had a resolution of 0.17 microns and the patterns had no standing waves and footing. A reference test using exactly the same method, but without the BARC layer showed patterns with severe standing waves, due to reflection from the silicon substrate, and the resolution was only 0.20 microns. The etch rate of the BARC using oxygen and fluoride gas plasma was measured to be 88 nm/min, whereas the resist had an etch rate of 85 nm/min.

EXAMPLE 2-1b TO 1h

The same procedures as Example 2-1a were repeated except simply varying the amount of 9-hydroxymethylanthracene(HMA) with respect to the isocyanate groups as described in Table 3. Deep ultraviolet BARC materials 1b to 1h with different n and k values and etch rates were obtained as showed in Table 3.

TABLE 3

| Example | mol % of HMA | refractive index (n) | absorption coefficient at 248 nm (k) | etch rate (nm/min) |
|---|---|---|---|---|
| 2-1a | 100 | 1.400 | 0.60 | 88 |
| 2-1b | 90 | 1.452 | 0.58 | 90 |
| 2-1c | 70 | 1.520 | 0.55 | 100 |
| 2-1d | 50 | 1.560 | 0.50 | 105 |
| 2-1e | 40 | 1.592 | 0.48 | 115 |
| 2-1f | 30 | 1.605 | 0.45 | 125 |
| 2-1g | 20 | 1.624 | 0.40 | 130 |
| 2-1h | 10 | 1.638 | 0.37 | 135 |

Similar to Application Example 1, the materials of Examples 2-1b to 2-1h were applied as a BARC material and evaluated by using, as resists, a positive- and a negative-working deep ultraviolet(DUV)resist, a positive-working argon fluoride (193 nm) resist, and a positive- and a negative-working i-line resists, as well as deep ultraviolet stepper with a 248 nm excimer laser exposure tool. They were all found to be effective in eliminating the problems (standing waves, reflective notching) associated with reflection and scattering of exposed radiation. In addition, similar to Example 2-1b to 2-1h, the BARC material of Example 2-1a was processed and evaluated. It showed good properties.

EXAMPLES 2-2 to 2-8

Similar to the procedure used in Example 2-1a except that 9-hydroxymethylanthracene was replaced with hydroxyl group containing dyes described in Table 4, reactions of the hydroxyl group containing dyes with poly(2-methacryloyloxyethyl isocyanate) were conducted and each polymer obtained (2-2 to 2-7) had a refractive index, absorption coefficient and etch rate as showed in Table 4.

TABLE 4

| Example | Dye with hydroxyl group | refractive index (n) | absorption coefficient at 365 nm (k) | etch rate (nm/min) |
|---|---|---|---|---|
| 2-2 | phenol | 1.612 | 0.21 | 141 |
| 2-3 | 4-hydroxybenzene sulfonamide | 1.640 | 0.24 | 143 |
| 2-4 | 4-hydroxy benzanilide | 1.544 | 0.30 | 138 |
| 2-5 | 1-hydroxy napthalene | 1.458 | 0.50 | 118 |
| 2-6 | 2-hydroxy-1-napthaldehyde | 1.495 | 0.54 | 115 |
| 2-7 | 2-hydroxy-4-chloroanisole | 1.438 | 0.45 | 153 |
| 2-8 | 4-hydroxy azobenzene | 1.510 | 0.60 | 120 |

Similar to Application Example 1, the materials of Examples 2-2 to 2-8 were applied as a BARC material and evaluated by using, as resists, a positive- and a negative-working deep ultraviolet (DUV) resist, a positive-working argon fluoride (193 nm) resist, and a positive- and a negative-working i-line resists, as well as the corresponding radiation tools. They were all found to be effective in eliminating the problems (standing waves, reflective notching) associated with reflection and scattering of exposed radiation.

EXAMPLE 3

Reaction of 1-aminoanthracene with poly(2-methacryloyloxyethyl isocyanate-co-methyl methacrylate) and application as a bottom anti-reflective coating material The same procedures as Examples 1-1a to 1-1d except that poly(2-methacryloyloxyethyl isocyanate) was replaced with poly(2-methacryloyloxyethyl isocyanate-co-methyl methacrylate) prepared in Synthesis Example 2 were conducted. The refractive index, absorption coefficient and etch rate of each BARC material obtained (3a to 3d) are showed in Table 5.

TABLE 5

| Example | mol % of AA* | refractive index (n) | absorption coefficient at 248 nm (k) | etch rate (nm/min) |
|---|---|---|---|---|
| 3-3a | 100 | 1.578 | 0.44 | 107 |
| 3-3b | 90 | 1.592 | 0.41 | 118 |
| 3-3c | 70 | 1.605 | 0.38 | 128 |
| 3-3d | 50 | 1.624 | 0.33 | 134 |

*with respect to AA feeding mol % towards isocyanate moieties

Similar to Application Example 1, the materials of Examples 3-3a to 3-3d were applied as BARC materials and evaluated by using, as resists, a positive- and a negative-working deep ultraviolet (DUV) resist, a positive-working argon fluoride (193 nm) resist, and a positive- and a negative-working i-line resists, as well as deep UV stepper with a 248 nm excimer laser exposure tool. They were all found to be effective in eliminating the problems (standing waves, reflective notching) associated with reflection and scattering of exposed light.

EXAMPLE 4

Reaction of 9-hydroxymethylanthracene with poly(2-methacryloyloxyethyl isocyanate-co-methyl methacrylate) and application as a bottom anti-reflective coating material The same procedures as Examples 2-1a to 2-1d except that poly(2-methacryloyloxyethyl isocyanate) was replaced with poly(2-methacryloyloxyethyl isocyanate-co-methyl methacrylate) prepared in Synthesis Example 2 were conducted. The refractive index, absorption coefficient and etch rate of each BARC material obtained (4a to 4d) are shown in Table 6.

TABLE 6

| Example | mol % of HMA* | refractive index (n) | absorption coefficient at 248 nm (k) | etch rate (nm/min) |
|---|---|---|---|---|
| 4-4a | 100 | 1.578 | 0.46 | 117 |
| 4-4b | 90 | 1.595 | 0.42 | 120 |
| 4-4c | 70 | 1.608 | 0.39 | 129 |
| 4-4d | 50 | 1.628 | 0.34 | 138 |

*with respect to HMA feeding mol % towards isocyanate moieties

Similar to Application Example 1, the materials of Examples 4-4a to 4-4d were applied as a BARC material and evaluated by using, as resists, a positive- and a negative-working deep ultraviolet (DUV) resist, a positive-working argon fluoride (193 nm) resist, and a positive- and a negative-working i-line resist, as well as a deep UV stepper with a 248 nm excimer laser exposure tool. They were all found to be effective in eliminating the problems (standing waves, reflective notching) associated with reflection and scattering of exposed radiation.

EXAMPLE 5

Synthesis of N-(1-anthracene)-N'-(2-methacryloyloxyethyl)urea

Into a dry three neck flask fitted with a dropping funnel and a thermometer, there was added 38.65 g (0.2 mol) of 1-aminoanthracene and it was dissolved in 200 g of dry tetrahydrofuran. The solution was cooled to 10° C. using an ice-water bath and to cool the solution, there was then added 31.03 g of 2-methacryloyloxyethyl isocyanate drop by drop from a dropping funnel. After the addition of 2-methacryloyloxyethyl isocyanate, the solution was allowed to return to room temperature (25° C.) and it was stirred at that temperature for 24 hours. The reaction mixture was a homogenous solution in the beginning and as the reaction between the isocyanate groups and aminoanthracene proceeded, a yellow color crystalline product appeared in the solution. The product was filtered using a glass filter, washed with n-hexane at least 3 times and dried at 40° C. under vacuum (1 Torr) The product had a melting point of 180±2° C. The yield was 95%. It was identified using IR and NMR spectroscopies. The infrared spectrum of the product showed peaks at 3341 cm$^{-1}$ (N—H), 17.15 cm$^{-1}$ (C=O, ester) and at 1635 cm$^{-1}$ (C=O, urea) as well as the complete disappearance of the peak at 2278 cm$^{-1}$ which is a characteristic of the isocyanate groups of the starting material methacryloyloxyethyl isocyanate. The $^1$H-NMR spectrum of the product showed signals at 1.9 ppm (3H/—CH$_3$), 3.3 (2H) and 4.2 (2H) ppm (CH$_2$), 5.7, 6.1 and 6.8 ppm [2H/CH$_2$=C(CH$_3$)], 7.5–8.8 (9H/anthracene H).

EXAMPLE 6

Synthesis, of N-(2-methacryloyloxyethyl)-9-methylanthracene carbamate

Into a dry three neck flask fitted with a dropping funnel and a thermometer, there was added 41.65 g (0.2 mol) of 9-hydroxymethylanthracene, 0.126 g of dibutyl tin dilaurate and they were dissolved in 200 g of dry tetrahydrofuran. The solution was cooled to 10° C. using a ice-water bath and to the cooled solution, there was then added 31.03 g (0.2 mol) of 2-methacryloyloxyethyl isocyanate drop by drop from a dropping funnel. After the addition of 2-methacryloyloxyethyl isocyanate, the solution was allowed to return to room temperature (25° C.) and it was stirred at that temperature for 24 hours. Unlike Example 5, the reaction mixture was homogenous throughout the reaction. The solution was crystallized using a THF/n-hexane mixed solvent, it was filtered using a glass filter, washed with n-hexane at least 3 times and dried at 40° C. under vacuum (1 Torr). The product had a melting point of 125±2° C. The yield was 95%. It was identified using IR and NMR spectroscopies. The infrared spectrum of the product showed peaks at 3323 cm$^{-1}$ (N—H), 1717 cm$^{-1}$ (C=O, ester) and at 1707 cm$^{-1}$ (C=O, carbamate) as well as the complete disappearance of the peak at 2278 cm$^{-1}$ which is a characteristic of the isocyanate groups of the starting material, methacryloyloxyethyl isocyanate. The $^1$H-NMR spectrum of the product showed signals at 1.82 ppm (3H/—CH$_3$), 3.3 (4H/CH$_2$) and 4.083 (2H) ppm (CH$_2$), 5.6–6.1 ppm [2H/CH$_2$=C(CH$_3$)], 7.3–8.7 (9H/anthracene H).

EXAMPLE 7

Polymerization of N-(i-anthracene)-N'-(2-methacryloyloxyethyl)urea

Into a three neck flask fitted with a condenser, a nitrogen inlet and a nitrogen outlet, there was added 69.68 g of N-(1-anthracene)-N'-(2-methacryloyloxyethyl)urea, 500 g of cyclohexanone and 0.65 g of AIBN. The reaction mixture was purged with nitrogen gas and heated to 70° C. under stirring for 7 hours. The reaction mixture was cooled to room temperature and a small portion of it was precipitated in methanol and the remainder was diluted to 5 wt % solids solution. The polymer had a weight average molecular weight (Mw) of 22,000 and a number average molecular weight: (Mn) of 9,700 as measured on GPC using a polystyrene standard. The remaining portion of the reaction mixture was filtered and evaluated as a BARC material as described in Application Example 1. The BARC film was checked under microscope and was found to be defect free and uniform. The optical parameters n and k values of the BARC film at 248 nm were found to be 1.412 and 0.61, respectively. Scanning electron microscopy observation of the line and space patterns of the deep ultraviolet (DUV) positive-working resist exposed by 248 nm exposure device showed that the resist profiles were vertical (88–90°) and had a maximum resolution of 0.17 microns and the patterns had no standing waves and footing. A reference test using exactly the same method but without the BARC layer showed patterns with severe standing waves due to reflection from the silicon substrate and the maximum resolution was only 0.2 microns. The etch rate of the BARC layer using oxygen and fluoride gas plasma was measured to be 89 nm/min whereas the resist had a etch rate of 85 nm/min. The step-coverage property was also evaluated as described in Application Example 1 and found to be very good.

EXAMPLE 8

Polymerization of N-(2-methacryloyloxyethyl)-9-methylanthracene carbamate

Into a three neck flask fitted with a condenser, a nitrogen inlet and a nitrogen outlet, there was added 72.681 g of N-(2-methacryloyloxyethyl)-9-methylanthracene carbamate, 500 g of cyclohexanone and 0.65 g of AIBN. The reaction mixture was purged with nitrogen gas and heated to 70° C. under stirring for 7 hours. The reaction mixture was cooled to room temperature and a small portion of it was precipitated in methanol and the remainder was diluted to 5 wt % solids solution. The polymer had a weight average molecular weight (Mw) of 28,000 and a number average molecular weight (Mn) of 12,700 as measured on GPC using polystyrene standard.

The remaining portion of the polymer solution was filtered and applied as a BARC material, then evaluated by the same method as Example 7. The material has n and k values of 1.405 and 0.61 respectively, etch rate of 90 nm/min and good step-coverage property.

EXAMPLE 9

Copolymerization of N-(2-methacryloyloxyethyl)-9-methylanthracene carbamate and methyl methacrylate Into a three neck flask fitted with a condenser, a nitrogen inlet and a nitrogen outlet, there was added 3.634 g (0.01 mol) of N-(2-methacryloyloxyethyl)-9-methylanthracene carbamate, 1.00 g (0.01 mol) of methyl methacrylate, 0.23 g of AIBN and 60 g of tetrahydrofuran and the contents were purged with dry nitrogen gas. The reaction mixture was heated to 70° C. and stirred at that temperature for 5 hours under flowing nitrogen gas. After the completion of the reaction, it was cooled to room temperature and the polymer was reprecipitated into n-hexane. The white powder obtained was dried under vacuum (1 Torr) at room temperature to yield 4 g (86%) of polymer. The infrared spectrum showed peaks at 1740 cm$^{-1}$, 1717 and 1707 cm$^{-1}$ (C=O). The copolymer was found to have about 40 mol % of methyl methacrylate units based on the $^1$H-NMR spectrum. The polymer had a weight average molecular weight (Mw) of 23,700 and a number average molecular weight (Mn) of 12,900 as measured on GPC using polystyrene standard.

The polymer was dissolved in propylene glycol monomethyl ether acetate (PGMEA) (3 wt % solids) and applied as a BARC as described in the Application Example 1, then evaluated by the same method as Example 7. The profiles of the resist pattern showed no standing waves due to reflection and scattering of light. The BARC material at 248 nm had n and k values of 1.58 and 0.54 respectively and etch rate of 138 nm/min.

EXAMPLE 10

Copolymerization of N-(2-methacryloyloxyethyl)-9-methylanthracene carbamate and 2-(methacryloyloxy)ethyl acetoacetate Into a three neck flask fitted with a condenser, a nitrogen inlet and a nitrogen outlet, there was added 3.634 g (0.01 mol) of N-(2-methacryloyloxyethyl)-9-methylanthracene carbamate, 2.142 g (0.01 mol) of 2-(methacryloyloxy)ethyl acetoacetate, 0.23 g of AIBN and 60 g of tetrahydrofuran and the contents were purged with dry nitrogen gas. The reaction mixture was heated to 70° C. and stirred at that temperature for 5 hours under flowing nitrogen gas. After the completion of the reaction, it was cooled to room temperature and the polymer was reprecipitated into n-hexane. The white powder obtained was dried under vacuum (1 Torr) at ,room temperature to yield 5 g (87%) of polymer. The infrared spectrum showed peaks at 1740 cm$^{-1}$, 1717 cm$^{-1}$ and 1707 cm$^{-1}$ (C=O). The copolymer was found to have about 45 mol % of 2-(methacryloyloxy)ethyl acetoacetate units based on the $^1$H-NMR spectrum. The polymer had a weight average molecular weight (Mw) of 23,700 and a number average molecular weight (Mn) of 12,900 as measured on GPC using polystyrene standard.

The polymer was dissolved in propylene glycol monomethyl ether acetate (PGMEA) (3 wt % solids) and applied as a BARC as described in the Application Example 1, then evaluated by the same method as Example 7. The profiles of the resist pattern showed no standing waves due to reflection and scattering of radiation. The BARC material at 248 nm had n and k values of 1.52 and 0.48 respectively and etch rate of 148 nm/min.

EXAMPLE 11

Copolymerization of methacryloyloxyethyl isocyanate and vinyl monomers containing chromophores Into a three neck flask fitted with a condenser, a nitrogen inlet and a nitrogen outlet, there was added 3.1 g of methacryloyloxyethyl isocyanate and 5.524 g of 9-anthracenemethyl methacrylate, 0.064 g of AIBN and 40 g of tetrahydrofuran and the contents were purged with dry nitrogen gas. The reaction mixture was heated to 70° C. and stirred at that temperature for 7 hours under flowing nitrogen gas. After the completion of the reaction, it was cooled to room temperature and the polymer was reprecipitated into n-hexane. The white powder obtained was dried under vacuum (1 Torr) at room temperature to yield 7 g of polymer. The infrared spectrum of the product showed peaks at 2278 cm$^{-1}$ (NCO), 1717 cm$^{-1}$ (C=O, acrylate). The content of methacryloyloxyethyl isocyanate in the polymer was found to be 57 mol % based on the $^1$H-NMR spectrum of the polymer. The polymer had a weight average molecular weight (Mw) of 24,300 and a number average molecular weight (Mn) of 14,400 as measured on GPC using polystyrene standard. The polymer was dissolved in propylene glycol monomethyl ether acetate (PGMEA) (5 wt % solids) and applied as a BARC material as described in the Application Example 1, then evaluated by the same method as Example 7. The profiles of the resist pattern showed no standing waves due to reflection and scattering of light and the BARC material had n and k values at 248 nm of 1.54 and 0.54 respectively and an etch rate of 108 nm/min. A reference BARC material comprising only the 9-anthracenemethyl methacrylate homopolymer was found to produce footing and intermixing problems, while the methacryloyloxyethyl isocyanate moieties of the present invention hardened the BARC film during the baking step to thereby prevent the intermixing of the resist and the BARC.

EXAMPLE 12

Use of isocyanate-containing compound as an hardening agent

To a bottom anti-reflective coating material comprising poly (methyl methacrylate-co-9-methylanthracene methacrylate) and cyclohexanone solvent, there was added 5 wt % solution of poly(methacryloyloxyethyl isocyanate) and the mixture was stirred. The solution thus prepared was used as a BARC as described in Application Example 1. Resist patterns were formed on the BARC by using a positive-working chemically amplified resist. Compared to the BARC material without the poly(methacryloyloxyethyl isocyanate) additive, the present formulation showed no intermixing problem as observed on a scanning electron microscopy.

EXAMPLE 13

Terpolymerization of N-(2-methacryloyloxyethyl)-9-methylanthracene carbamate, methyl methacrylate and 2-methacryloyloxyethyl isocyanate, conversion of isocyanate groups in terpolymer into blocked isocyanate groups using ethanol and application thereof as a BARC material Into a three neck flask fitted with a condenser, a nitrogen inlet and a nitrogen outlet, there was added 3.634 g (0.01 mol) of N-(2-methacryloyloxyethyl)-9-methylanthracene carbamate, 2.00 g (0.02 mol) of methyl methacrylate, and 1.55 g (0.01 mol) of 2-methacryloyloxyethyl isocyanate and 0.287 g of AIBN and 60 g of tetrahydrofuran and the contents were purged with dry nitrogen gas. The reaction mixture was heated to 70° C. and stirred at that temperature for 5 hours under flowing nitrogen gas. After the completion of the reaction, it was cooled to room temperature and the polymer was reprecipitated into n-hexane. The white powder obtained was dried under vacuum (1 Torr) at room temperature to yield 5.75 (80%) of polymer. The infrared spectrum showed peaks at 2273 cm$^{-1}$ (NCO), 1740 cm$^{-1}$, 1717 and 1707 cm$^{-1}$ (C=O). The terpolymer was found to have about 25 mol % of units of N-(2-methacryloyloxyethyl)-9-methylanthracene carbamate based on the $^1$H-NMR spectrum. The polymer had a weight average molecular weight (Mw) of 15,700 and a number average molecular weight (Mn) of 10,900 as measured on GPC using polystyrene standard. Part of the polymer was dissolved in PGMEA (3 wt % solids) and applied as a BARC material, then evaluated by the same method as described in the Application Example 1 using a positive-working chemically amplified photoresist. The profiles showed no standing waves due to reflection and scattering of light and the BARC material had n and k values of 1.48 and 0.40 at 248 nm, respectively, and an etch rate of 148 nm/min.

2 g of the terpolymer thus prepared was stirred at room temperature in 50 ml of ethanol for 48 hours. The ethanol was evaporated using vacuum and the polymer obtained was characterized using infrared spectrum. The peak at 2273 cm$^{-1}$ (NCO) disappeared indicating that the NCO groups have been blocked with the ethanol.

The polymer was dissolved in propylene glycol monomethyl ether acetate (3 wt % solids) was applied as a BARC material and evaluated by the same method as described in the Application Example 1 using a positive-working chemically amplified photoresist. The profiles showed no standing waves due to reflection and scattering of radiation and the BARC material had n and k values of 1.48 and 0.40 at 248 nm respectively and etch rate of 152 nm/min.

EXAMPLE 14

Terpolymerization of N-(2-methacryloyloxyethyl)-9-methylanthracene carbamate in which isocyanate groups thereof are blocked with p-nitrophenol, methyl methacrylate and 2-methacryloyloxyethyl isocyanate and application as BARC material Into a three neck flask fitted with a condenser, a nitrogen inlet and a nitrogen outlet, there was added 3.634 g (0.01 mol) of N-(2-methacryloyloxyethyl)-9-methylanthracene carbamate, 2.00 g (0.02 mol) of methyl methacrylate, 1.55 g (0.01 mol) of 2-methacryloyloxyethyl isocyanate, 0.287 g of AIBN and 60 g of tetrahydrofuran and the contents were purged with dry nitrogen gas. The reaction mixture was heated to 70° C. and stirred at that temperature for 5 hours under flowing nitrogen gas. After the completion of the reaction, it was cooled to room temperature. To the reaction solution, 0.0252 g of dibutyl tin dilaurate and 1.391 g (0.01 mol) of p-nitrophenol were added and it was stirred at 25° C. for 3 days. The polymer was isolated by reprecipitation, by using a blender, in isopropanol, filtered, washed three times using about 300 ml of isopropanol each time. The polymer powder obtained was dried to constant weight under vacuum (1 Torr) at 25° C. The yield was 5 g (76%). The polymer had a weight average molecular weight (Mw) of 20,700 and a number average molecular weight (Mn) of 9,000 as measured on GPC using a polystyrene standard. The infrared spectrum showed no peaks at 1740 cm$^{-1}$, 1717 and 1707 cm$^{-1}$ (C=O). A 5 wt % solution of the polymer in ethyl lactate was applied and evaluated as a BARC material as described in Application Example 1. The profiles showed no standing waves due to reflection and scattering of radiation and the BARC material had n and k values of 1.48 and. 0.42 respectively and an etch rate of 155 nm/min.

Effect of the Invention

As described above, the anti-reflective coating materials, radiation absorbing coating material, anti-reflective coating compositions and radiation absorbing coating materials of the present invention have no problems concerning standing waves and reflective notching due to high anti-reflectivity. In addition, due to no diffusion of acids generated on exposure to the anti-reflective coating and no intermixing with a resist, problems of footing and residue of the resist on the substrate in exposed areas do not take place. The compositions of the present invention also have long shelf-life and good step coverage. For this reason, resist patterns with high resolution and high precision can be formed according to the present invention. The present invention is very useful for manufacturing integrated circuits with a high degree of integration.

Industrial Applicability

The monomeric dye of the present invention are used as raw materials for the synthesis of polymers forming an anti-reflective coating or a radiation absorbing coating and materials for forming an anti-reflective coating or a radiation absorbing coating. The polymers and the compositions of the present invention are utilized as an anti-reflective coating or radiation absorbing coating material in manufacturing integrated circuits by a photolithographic process.

What is claimed is:

1. A composition for an anti-reflective coating or a radiation absorbing coating containing a polymer as represented by the following General Formula II General Formula II:

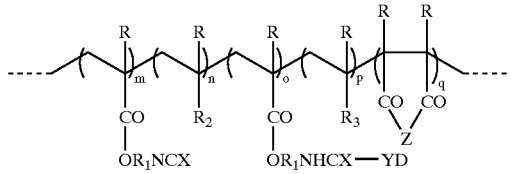

wherein

R is a hydrogen atom or an alkyl group; $R_1$ is an alkylene group, a substituted alkylene group, a cycloalkylene group, a substituted cycloalkylene group, a phenylene group or a substituted phenylene group; $R_2$ is a phenyl group, —COOH, a halogen atom, a cyano group, an alkoxyl group or —COOR$_6$ in which $R_5$ is a substituted or non-substituted alkyl or aryl group or an ethylacetoacetate group: $R_3$ is ROOD; D is an organic chromophore which absorbs the exposed wavelength (100–450 nm) and represents a substituted or non-substituted benzene ring, condensed ring or heterocyclic ring bonded directly or through an alkylene group; X is O or S; Y is O; Z is O, ND group or NR$_5$ group in which R$_5$ is either a hydrogen atom or a substituted or non-substituted phenyl group or cyclic, linear or branched alkyl group; and n, p and q are simple integers including zero and m and o are greater than zero.

2. A composition for an anti-reflective coating or a radiation absorbing coating according to claim 1, wherein the polymer as represented by General Formula II is a polymer as represented by the following General Formula II'

General Formula II:

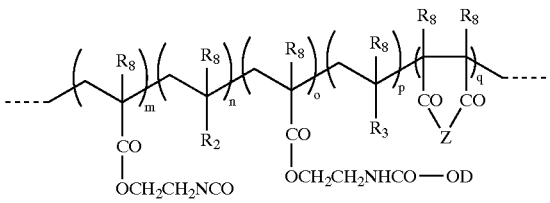

wherein $R_8$ is a hydrogen atom or a methyl group; $R_2$ is a phenyl group, —COOH, a halogen atom, a cyano group, an alkoxyl group or —COOR$_6$ in which $R_6$ is a substituted or non-substituted alkyl or aryl group or an ethylacetoacetate group; $R_3$ is —COOD; D is an organic chromophore which absorbs the exposed wavelength (100–450 nm) and represents a substituted or non-substituted benzene ring, condensed ring or heterocyclic ring bonded directly or through an alkylene group; Z is O, ND group or NR$_5$ group in which $R_4$ is either a hydrogen atom or a substituted or non-substituted phenyl group or cyclic, linear or branched alkyl group; and m, n, o, p and q are simple integers including zero, m and o are greater than zero and m, n, o, p and q together lie between 5 to 50,000.

3. A composition for an anti-reflective coating or a radiation absorbing coating containing a polymer as represented by the following General Formula II"

General Formula II":

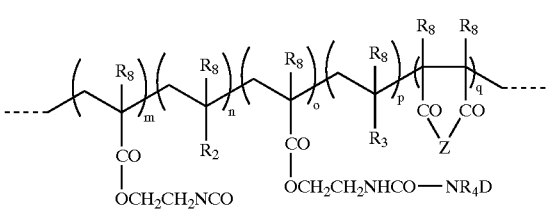

wherein $R_8$ is a hydrogen atom or a methyl group; $R_2$ is a phenyl group, —COOH, a halogen atom, a cyano group, an alkoxyl group or —COOR$_6$ in which $R_6$ is a substituted or non-substituted alkyl or aryl group or an ethylacetoacetate group; $R_3$ is —COOD; D is an organic chromophore which absorbs the exposed wavelength (100–450 nm) and is a group selected from phenyl, benzyl, naphthalene, substituted naphthalene, anthracene, substituted anthracene, anthraquinone, substituted anthraquinone, acridine, substituted acridine, azobenzene, substituted azobenzene, fluorene, substituted fluorene, fluorenone, substituted fluorenone, carbazole, substituted carbazole, N-alkylcarbazole, dibenzofuran, substituted dibenzofuran, phenanthrene, substituted phenanthrene, pyrene and substituted pyrene bonded directly or through an alkylene group, and the substitutions thereof are at least one group selected from alkyl, aryl, halogen, alkoxyl, nitro, aldehyde, cyano, amide, dialkylamino, sulfonamide, imide, carboxylic acid, carboxylic acid ester, sulfonic acid, sulfonic add ester, alkylamino, and arylamino: $R_4$ is either a hydrogen atom or a substituted or non-substituted phenyl group or cyclic linear or branched alkyl group; Z is O, ND group or NR$_5$ group in which $R_5$ is either a hydrogen atom or a substituted or non-substituted phenyl group or cyclic, linear or branched alkyl group; and m, n, o, p and q are simple integers including zero, m and o are greater than zero and m, n, o, p and q together lie between 5 to 50,000.

4. A composition for an anti-reflective coating or a radiation absorbing coating according to claim 2, wherein D is a group selected from phenyl, benzyl, naphthalene, substituted naphthalene, anthracene, substituted anthracene, anthraquinone, substituted anthraquinone, acridine, substituted acridine, azobenzene, substituted azobenzene, fluorene, substituted fluorene, fluorenone, substituted fluorenone, carbazole, substituted carbazole, N-alkylcarbazole, dibenzofuran, substituted dibenzofuran, phenanthrene, substituted phenanthrene, pyrene, and substituted pyrene, and the substitutions thereof are at least one group selected from alkyl, aryl, halogen, alkoxyl, nitro, aldehyde, cyano, amide, dialkylamino, sulfonamide, imide, carboxylic acid, carboxylic acid ester, sulfonic acid, sulfonic acid ester, alkylamino, and arylamino.

5. A composition for an anti-reflective coating or a radiation absorbing coating according to claim 2 or 3, wherein n, p and q are zero and m and o together lie between 5 to 50,000 and the mole fraction of m is between 0.05 to 0.95.

6. A composition for an anti-reflective coating or a radiation absorbing coating according to claim 2 or 3, wherein $R_2$ is —COOR$_6$ in which $R_6$ is methyl group, ethyl group, t-butyl group, isopropyl group, ethylacetoacetate group, 2-hydroxyethyl group, or n-butyl group.

7. A composition for an anti-reflective coating or a radiation absorbing coating according to claim 2 or 3, wherein p and q are zero and m, n and o together lie between 5 to 50,000 and the mole fraction of n is between 0.05 to 0.95.

8. A composition for an anti-reflective coating or a radiation absorbing coating according to claim 2 or 3, wherein n and q are zero and m, o and p together lie between 5 to 60,000 and the mole fraction of m is between 0.05 to 0.90.

9. A composition for an anti-reflective coating or a radiation absorbing coating according to claim 2 or 3, wherein q is zero and m, n, o and p together lie between 5 to 50,000.

10. A composition for an anti-reflective coating or a radiation absorbing coating in which the polymer of claim 1 and/or the compound of General Formula III

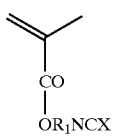

General Formula III is/are further added to a composition for an anti-reflective coating or a radiation absorbing coating containing free amines or hydroxyl group containing compounds.

11. A composition for an anti-reflective coating or a radiation absorbing coating containing the polymer of claim 1, wherein the proportion of total molar numbers of monomers and monomer units of polymer which have isocyanate group, thioisocyanate group or blocked derivatives thereof to total molar numbers of monomers and monomer units of polymers in the composition is 0.1 to 40% by weight.

12. A polymer as represented by the following General Formula II

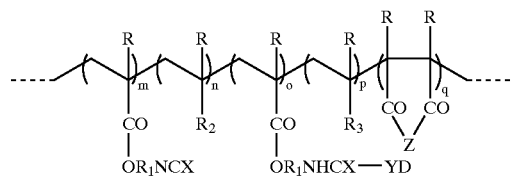

General Formula II wherein R is a hydrogen atom or a methyl group, $R_1$ is an ethylene group, X is an oxygen atom and Y is an oxygen atom, $R_2$ is a phenyl group, —COOH, a halogen atom, a cyano group, an alkoxyl group or —COOR$_6$ in which $R_6$ is a substituted or non-substituted alkyl or aryl group or an ethylacetoacetate group; $R_3$ is —COOD; Z is O, ND group or NR$_5$ group in which R$_5$ is either a hydrogen atom or a substituted or non-substituted phenyl group or cyclic, linear or branched alkyl group; D is an organic chromophore which absorbs the exposed wavelength (100–450 nm) and is a group selected from phenyl, benzyl, naphthalene, anthracene, substituted anthracene, anthraquinone, substituted anthraquinone, acridine, substituted acridine, azobenzene, substituted azobenzene, fluorene, substituted fluorene, fluorenone, substituted fluorenone, carbazole, substituted carbazole, N-alkylcarbazole, dibenzofuran, substituted dibenzofuran, phenanthrene, substituted phenanthrene, pyrene and substituted pyrene, and the substitutions thereof at least one group selected from alkyl, aryl, halogen, aloxy, nitro, aldehyde, cyano, amide, dialkylamino, alkylamino, sulfonamide, imide, carboxylic acid, carboxylic acid ester, sulfonic acid, sulfonic acid ester, and arylamino, and m, n, p and q are simple integers including zero and o is a simple integer which is greater than zero.

13. A polymer as represented by the following General Formula II

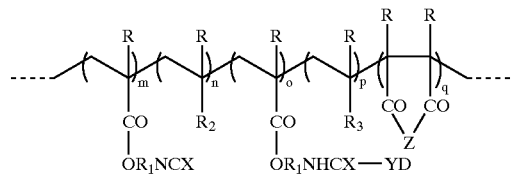

General Formula II wherein R is a hydrogen atom or a methyl group, $R_1$ is an ethylene group, X is an oxygen atom, Y is —NR$_4$ group in which $R_4$ is either a hydrogen atom or a substituted or non-substituted phenyl group or cyclic, linear or branched alkyl group, $R_2$ is a phenyl group, —COOH, a halogen atom, a cyano group, an alkoxyl group or —COOR$_6$ in which $R_6$ is a substituted or non-substituted alkyl or aryl group or an ethylacetoacetate group: $R_3$ is —COOD; Z is O, ND group or NR$_5$ group in which R$_5$ is either a hydrogen atom or a substituted or non-substituted phenyl group or cyclic, linear or branched alkyl group; D is an organic chromophore which absorbs the exposed wavelength (100–450 nm) and is a group selected from phenyl, benzyl, naphthalene, anthracene, substituted anthracene, anthraquinone, substituted anthraquinone, acridine, substituted acridine, azobenzene, substituted azobenzene, fluorene, substituted fluorene, fluorenone, substituted fluorenone, carbazole, substituted carbazole, N-alkylcarbazole, dibenzofuran, substituted dibenzofuran, phenanthrene, substituted phenanthrene, pyrene and substituted pyrene bonded directly or through an alkylene group, and the substitutions thereof are at least one group selected from alkyl, aryl, halogen, alkoxy, nitro, aldehyde, cyano, amide, dialkylamino, alkylamino, sulfonamide, imide, carboxylic acid, carboxylic acid ester, sulfonic acid, sulfonic acid ester, and arylamino; and n, p and q are simple integers including zero and m and o are simple integers greater than zero.

14. A method of producing a composition for an anti-reflective coating or a radiation absorbing coating containing a polymer as represented by the following General Formula II, General Formula II:

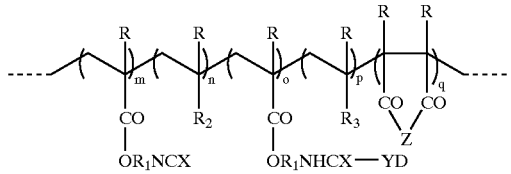

wherein

R is a hydrogen atom or an alkyl group; $R_1$ is an alkylene group, a substituted alkylene group, a cycloalkylene group, a substituted cycloalkylene group, a phenylene group or a substituted phenylene group; $R_2$ is a phenyl group, —COOH, a halogen atom, a cyano group, an alkoxyl group or —COOR$_6$ in which $R_6$ is a substituted or non-substituted alkyl or aryl group or an ethylacetoacetate group; $R_3$ is —COOD; D is an organic chromophore which absorbs the exposed wavelength (100–450 nm) and represents a substituted or non-substituted benzene ring, condensed ring or heterocyclic ring bonded directly or through an alkylene group; X is O or S; Y is O or $NR_4$ group in which R is either a hydrogen atom or a substituted or non-substituted phenyl group or cyclic, linear or branched alkyl group; Z is O, ND group or $NR_5$ group in which $R_5$ is either a hydrogen atom or a substituted or non-substituted phenyl group or cyclic, linear or branched alkyl group; and n, p and q are simple integers including zero and m and o are also simple integers including zero while at least one of them is greater than zero which comprises the following steps:

a) dissolving a polymer having the formula

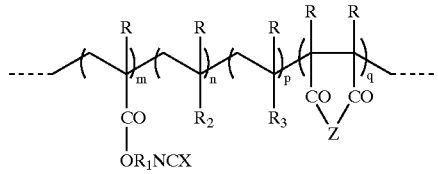

wherein R, $R_1$, $R_2$, $R_3$, X, Z, m, n, p, and q are as defined above having isocyanate groups in one or more solvents, and b) reacting the isocyanate groups either partially or fully with amino aromatic and/or hydroxyl aromatic chromophores at room temperature or elevated temperature if necessary.

15. A method of forming an anti-reflective coating or a radiation absorbing coating which comprises the following steps:

a) filtering the composition for an anti-reflective coating or a radiation absorbing coating produced by the method of claim 14 with 0.5 and 0.2 micron filters, b) applying the filtered solution directly onto a semiconductor substrate, and c) baking the coated substrate at 50 to 250° C.

16. An anti-reflective coating or a radiation absorbing coating formed by the method of claim 15.

17. A method of producing a composition for an anti-reflective coating or a radiation absorbing coating of claim 14, wherein the solvent is cyclopentanone, cyclohexanone, butyrolactone, propylene glycol monomethyl ether acetate, 2-heptanone, ethyl lactate, ethyl-3-thoxy propanate, ethylene glycol monoethyl acetate, or methyl-3-methoxy propanate individually or mixtures thereof.

18. A method of forming an anti-reflective coating or a radiation absorbing coating which comprises the following steps: a) applying the composition for an anti-reflective coating or a radiation absorbing coating of claim 1, 2 or 3 onto a semiconductor substrate, and b) removing the solvent at least partially by baking to form a substrate coated with an anti-reflective coating or a radiation absorbing coating.

19. An anti-reflective coating or a radiation absorbing coating formed by the method of claim 18.

20. A composition for an anti-reflective coating or a radiation absorbing coating containing a polymer as represented by the following General Formula II General Formula II:

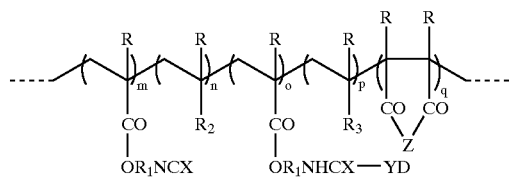

wherein

R is a hydrogen atom or a methyl group; $R_1$ is —CH$_2$CH$_2$—, or a phenylene group; $R_2$ is a phenyl group, —COOH, a halogen atom, a cyano group, or —COOR$_6$ in which $R_6$ is a member selected from the group consisting of methyl group, ethyl group, t-butyl group, isopropyl group, ethylacetoacetate group, 2-hydroxyethyl group, and n-butyl group; $R_3$ is —COOD; D is a member selected from the group consisting of phenyl, benzyl, naphthalene, substituted naphthalene, anthracene, substituted anthracene, anthraquinone, substituted anthraquinone, acridine, substituted acridine, azobenzene, substituted azobenzene, fluorene, substituted fluorene, fluorenone, substituted fluorenone, carbazole, substituted carbazole, dibenzofuran, substituted dibenzofuran, phenanthrene, substituted phenanthrene, pyrene and substituted pyrene, bonded directly or through a methylene group, wherein the substituents are at least one member selected from the group consisting of nitro, aldehyde, cyano, carboxylic acid, sulfonic acid; X is O or S; Y is O or $NR_4$ group in which $R_4$ is either a hydrogen atom or a phenyl group; Z is O, ND group or $NR_5$ group in which $R_3$ is either a hydrogen atom or a phenyl group; and m, n, o, p and q are simple integers including zero provided at least one of the following conditions are met:

(1) n, p and q are zero, sum of m and o is between 5 to 50,000 and mol traction of m is between 0.05 to 0.95, (2) p and q are zero, sum of m, n and o is between 5 to 50,000 and mol fraction of n is between 0.05 to 0.95, (3) n and p are zero, sum of m, o and q is between 5 to 50,000 and mol fraction of q is between 0.05 to 0.50, (4) n and q are zero, sum of m, o and p is between 5 to 50,000 and mol fraction of m is between 0.05 to 0.90, and (5) q is zero and sum of m, n, o and p is between 5 to 50,000.

21. The composition of claim 20, wherein $R_1$ is —$CH_2CH_2$—; $R_2$ is —$COOR_5$; $R_4$ is a hydrogen atom; and $R_5$ is a hydrogen atom.

22. A composition for an anti-reflective coating or a radiation absorbing coating containing a polymer as represented by the following General Formula II and/or blocked derivatives thereof, General Formula II:

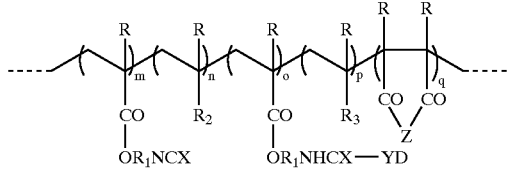

wherein

R is a hydrogen atom or an alkyl group; $R_1$ is an alkylene group, a substituted alkylene group, a cycloalkylene group, a substituted cycloalkylene group, a phenylene group or a substituted phenylene group; $R_2$ is a phenyl group, —COOH, a halogen atom, a cyano group, an alkoxyl group or —$COOR_6$ in which $R_6$ is a substituted or non-substituted alkyl or aryl group or an ethylacetoacetate group; $R_3$ is —COOD; D is an organic chromophore which absorbs the exposed wavelength (100–450 nm) and represents a substituted or non-substituted benzene ring, condensed ring or heterocyclic ring bonded directly or through an alkylene group; X is O or S; Y is O; Z is O, ND group or $NR_5$ group in which $R_5$ is either a hydrogen atom or a substituted or non-substituted, phenyl group or cyclic, linear or branched alkyl group; and n, p and q are simple integers including zero and m and o also simple integers greater than zero; wherein the proportion of total molar numbers of monomer units of polymer which have isocyanate group, thioisocyanate group or blocked derivatives thereof to total molar numbers of monomers and monomer units of polymers in the composition is 0.1 to 40 mol %.

23. A composition for an anti-reflective coating or a radiation absorbing coating containing a polymer as represented by the following General Formula II General Formula II:

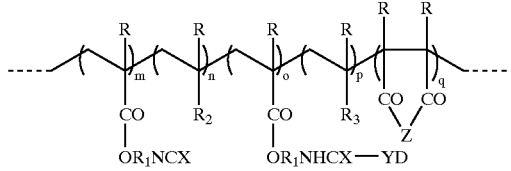

wherein

R is a hydrogen atom or an alkyl group; $R_1$ is an alkylene group, a substituted alkylene group, a cycloalkylene group, a substituted cycloalkylene group, a phenylene group or a substituted phenylene group; $R_2$ is a phenyl group, —COOH, a halogen atom, a cyano group, an alkoxyl group or —$COOR_6$ in which $R_6$ is a substituted or non-substituted alkyl or aryl group or an ethylacetoacetate group; $R_3$ is —COOD; D is an organic chromophore which absorbs the exposed wavelength (100–450 nm) and represents a substituted or non-substituted benzene ring, condensed ring or heterocyclic ring bonded directly or through an alkylene group; X is O or S; Y is O; Z is O, ND group or $NR_5$ group in which $R_5$ is either a hydrogen atom or a substituted or non-substituted, phenyl group or cyclic, linear or branched alkyl group; and n, p and q are simple integers including zero and m and o are, simple integers greater than 0; further provided that at least one of the following conditions is met: (1) m and q are both greater than 0; (2) n and o are both greater than 0; (3) n and p are both greater than 0; (4) m and p are both greater than 0; and (5) m, n, and o are all greater than 0.

24. The composition of claim 23, wherein $R_1$ is —$CH_2CH_2$—; $R_2$ is —$COOR_6$; $R_4$ is a hydrogen atom; and $R_5$ is a hydrogen atom.

25. A composition for an anti-reflective coating or a radiation absorbing coating containing a polymer as represented by the following General Formula II'

General Formula II'

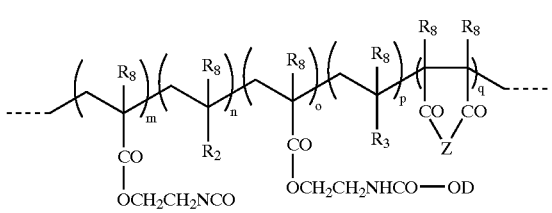

wherein $R_8$ is a hydrogen atom or a methyl group; $R_2$ is a phenyl group, —COOH, a halogen atom, a cyano group, an alkoxyl group or —$COOR_6$ in which $R_6$ is a substituted or non-substituted alkyl or aryl group or an ethylacetoacetate group; $R_3$ is —COOD; D is an organic chromophore which absorbs the exposed wavelength (100–450 nm) and represents a substituted or non-substituted benzene ring, condensed ring or heterocyclic ring bonded directly or through an alkylene group; Z is O, ND group or $NR_6$ group in which $R_5$ is either a hydrogen atom or a substituted or non-substituted phenyl group or cyclic, linear or branched alkyl group; and m, n, o, p and q are simple integers including zero while m and o are greater than zero and m, n, o, p and q together lie between 5 to 50,000; further provided that at least one of the following conditions is met: (1) m and q are both greater than 0; (2) n and o are both greater than 0; (3) n and p are both greater than 0; (4) m and p are both greater than 0; and (5) m, n, and o are all greater than 0.

26. A composition for an anti-reflective coating or a radiation absorbing: coating according to claim 25, wherein D is a group selected from phenyl, benzyl, naphthalene, substituted naphthalene, anthracene, substituted anthracene, anthraquinone, substituted anthraquinone, acridine, substituted acridine, azobenzene, substituted, azobenzene, fluorene, substituted fluorene, fluorenone, substituted fluorenone, carbazole, substituted carbazole, N-alkylcarbazole, dibenzofuran, substituted dibenzofuran, phenanthrene, substituted phenanthrene, pyrene and substituted pyrene, and the substitutions thereof are at least one group selected from alkyl, aryl, halogen, alkoxyl, nitro, aldehyde, cyano, amide, dialkylamino, sulfonamide. imide, carboxylic acid, carboxylic acid ester, sulfonic acid, sulfonic acid ester, alkylamino, and arylamino.

27. A composition for an anti-reflective coating or a radiation absorbing coating containing a polymer as represented by the following General Formula II″

General Formula II″

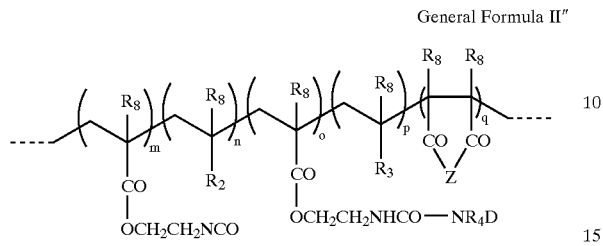

wherein $R_8$ is a hydrogen atom or a methyl group; $R_2$ is a phenyl group, —COOH, a halogen atom, a cyano group, an alkoxyl group or —COOR$_6$ in which $R_6$ is a substituted or non-substituted alkyl or aryl group or an ethylacetoacetate group; $R_3$ is —COOD; D is an organic chromophore which absorbs the exposed wavelength (100–450 nm) and is a group selected from phenyl, benzyl, naphthalene, substituted naphthalene, anthracene, substituted anthracene, anthraquinone, substituted anthraquinone, acridine, substituted acridine, azobenzene, substituted azobenzene, fluorene, substituted fluorene, fluorenone, substituted fluorenone, carbazole, substituted carbazole, N-alkylcarbazole, dibenzofuran, substituted dibenzofuran, phenanthrene, substituted phenanthrene, pyrene and substituted pyrene bonded directly or through an alkylene group, and the substitutions thereof are at least one group selected from alkyl, aryl, halogen, alkoxyl, nitro, aldehyde, cyano, amide, dialkylamino, sulfonamide, imide, carboxylic acid, carboxylic acid ester, sulfonic acid, sulfonic acid ester, alkylamino, and arylamino: $R_4$ is either a hydrogen atom or a substituted or non-substituted phenyl group or cyclic, linear or branched alkyl group; Z is O, ND group or NR$_5$ group in which $R_5$ is either a hydrogen atom or a substituted or non-substituted phenyl group or cyclic, linear or branched alkyl group; and m, n, o, p and q are simple integers including zero while m and o are greater than zero and m, n, o, p and q together lie between 5 to 50; further provided that at least one of the following conditions is met: (1) m and q are both greater than 0; (2) n and o are both greater than 0; (3) n and p are both greater than 0; (4) m and p are both greater than 0; and (5) m, n, and o are all greater than 0.

* * * * *